US006389490B1

(12) United States Patent
Camilleri et al.

(10) Patent No.: US 6,389,490 B1
(45) Date of Patent: May 14, 2002

(54) FIFO MEMORY SYSTEM AND METHOD WITH IMPROVED GENERATION OF EMPTY AND FULL CONTROL SIGNALS IN ONE CLOCK CYCLE USING ALMOST EMPTY AND ALMOST FULL SIGNALS

(75) Inventors: Nicolas J. Camilleri, San Jose; Peter H. Alfke, Los Altos, both of CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 09/569,591

(22) Filed: May 9, 2000

Related U.S. Application Data

(62) Division of application No. 09/414,987, filed on Oct. 7, 1999.

(51) Int. Cl.[7] ............................ G06F 13/00; G06F 5/06; G11C 19/00
(52) U.S. Cl. ........................ 710/57; 710/52; 711/109; 365/221; 365/189.07
(58) Field of Search ..................... 710/52, 57; 711/109, 711/110; 365/221, 189.07

(56) References Cited

U.S. PATENT DOCUMENTS

| | | | |
|---|---|---|---|
| 4,748,588 A | 5/1988 | Norman et al. | 713/400 |
| 4,873,667 A | 10/1989 | Geadah et al. | 365/189.07 |
| 4,888,739 A | * 12/1989 | Frederick et al. | 365/221 |
| 4,891,788 A | 1/1990 | Kreifels | 365/49 |
| 4,942,553 A | 7/1990 | Dalrymple et al. | 710/57 |
| 5,084,841 A | 1/1992 | Williams et al. | 365/189.07 |
| 5,088,061 A | 2/1992 | Golnabi et al. | 365/189.01 |
| 5,220,586 A | 6/1993 | Tai | 377/39 |
| 5,262,996 A | 11/1993 | Shiue | 365/221 |
| 5,311,475 A | 5/1994 | Huang | 365/221 |
| 5,381,126 A | 1/1995 | McClure | 340/146.2 |
| 5,426,756 A | 6/1995 | Shyl et al. | 711/159 |

(List continued on next page.)

OTHER PUBLICATIONS

Xilinx Data Book entitled "Field Programmable Gate Array Family Data Book", XC4000E Series, Preliminary Specifications, available from Xilinx, Inc., 2100 Logic Drive, San Jose, California 95124, published Sep. 7, 1995 (Version 1.04).

Xilinx Programmable Gate Array Data Book, 1999, pp. 3–1 to 3–22, available from Xilinx, Inc., 2100 Logic Drive, San Jose, CA 95124.

Primary Examiner—Glenn Gossage
(74) Attorney, Agent, or Firm—Patrick T. Bever; Lois D. Cartier

(57) ABSTRACT

A first in, first out (FIFO) memory system and method in which the full or empty condition of the FIFO memory is detected before the FIFO memory is actually full or empty, thereby allowing the generation of FULL or EMPTY control signals immediately after a last data value is written into or from the FIFO memory. An almost-empty condition, is detected by comparing the read address and write address values. When the read and write address values indicate that one data value remains in the FIFO memory and a read operation is about to be performed, an ALMOST_EMPTY control signal is applied to a data input terminal of a first register that is clocked by a read clock signal. The ALMOST_EMPTY control signal is latched by the first register at the next rising edge of a read clock signal, thereby causing the register to generate a high EMPTY control signal in the same read clock cycle during which the last data value is read from the FIFO memory. Similarly, an almost-full condition, is also detected by comparing the read address and write address values. By preventing a write address counter from "catching up" to a read address counter, the determination of FULL and EMPTY conditions is greatly simplified. The FIFO memory system may also include binary-to-Gray-code converters as well as a write synchronization circuit for synchronizing a binary read address to a write clock signal to provide an accurate indication of the amount of data stored in the FIFO memory.

23 Claims, 9 Drawing Sheets

U.S. PATENT DOCUMENTS

| | | | |
|---|---|---|---|
| 5,473,756 A | * 12/1995 | Traylor | 710/57 |
| 5,491,659 A | * 2/1996 | Howarter et al. | 365/219 |
| 5,506,809 A | * 4/1996 | Csoppenszky et al. | 365/221 |
| 5,555,524 A | 9/1996 | Castellano | 365/221 |
| 5,557,575 A | * 9/1996 | Lee | 365/221 |
| 5,629,886 A | 5/1997 | New | 708/711 |
| 5,758,192 A | 5/1998 | Alfke | 710/57 |
| 5,781,802 A | * 7/1998 | Cassetti | 710/57 |
| 5,898,893 A | 4/1999 | Alfke | 710/57 |
| 5,956,748 A | * 9/1999 | New | 711/149 |
| 6,097,656 A | * 8/2000 | Kim | 365/221 |
| 6,263,410 B1 | * 7/2001 | Kao et al. | 711/156 |

* cited by examiner

FIFO MEMORY SYSTEM AND METHOD WITH IMPROVED GENERATION OF EMPTY AND FULL CONTROL SIGNALS IN ONE CLOCK CYCLE USING ALMOST EMPTY AND ALMOST FULL SIGNALS

CROSS-REFERENCE TO RELATED APPLICATIONS

This application is a divisional application of commonly assigned, co-pending U.S. patent application Ser. No. 09/414,987, invented by Nicolas J. Camilleri, Peter H. Alfke, and Christopher D. Ebeling, entitled "Structure and Method for Operating a FIFO Memory System" and filed Oct. 7, 1999, which is incorporated herein by reference.

FIELD OF THE INVENTION

This invention relates to a first in, first out (FIFO) memory system. More particularly, this invention relates to a method and structure for controlling an asynchronous FIFO memory system, and for determining the amount of data currently stored in a FIFO memory of the asynchronous FIFO memory system.

DESCRIPTION OF THE PRIOR ART

Data values sequentially written to a memory of a FIFO memory system are sequentially read from the memory in a first in, first out manner. Most FIFO memory systems are implemented with random access memories having two separate address counters. One address counter is used to maintain a current read address and the other counter is used to maintain a current write address. A FIFO memory system in which both the read address counter and the write address counter are clocked by the same clock signal is referred to as a "synchronous" FIFO memory system. In contrast, a FIFO memory system in which the read address counter and the write address counter are clocked by memory system.

In both synchronous and asynchronous FIFO systems, both the read and write address counters are circular counters that wrap around to an initial address after a last address is accessed. The read and write address counter output signals are either multiplexed to address a single-port random access memory (RAM), or they are separately provided to address different input ports of a multi-port RAM (e.g., a dual-port RAM). In either scheme, two extreme conditions, namely FIFO EMPTY and FIFO FULL, must be detected to ensure proper operation of the FIFO memory system. The FIFO EMPTY condition must be detected so that read operations from the memory can be prevented during the time that the memory is empty (since there are no valid data values present in the memory to read). The FIFO FULL condition must be detected so that write operations to the memory can be prevented during the time that the memory is full (since there is no memory space present in the memory to store any additional data values).

The contents of the read and write address counters are typically used to determine whether the memory is empty or full. To do this, the contents of the read and write address counters are compared. If the contents of the read address counter are identical to the contents of the write address counter, the memory is either empty or full. However, identifying that the contents of the read address counter and the write address counter are identical, by itself, does not distinguish whether the memory is empty or full. That is, the contents of the read address counter are identical to the contents of the write address counter when the memory is empty, and also when the memory is full.

One conventional method used to determine whether the memory is empty or full is to detect what type of operation caused the contents of the read and write address counters to match. If a read operation was performed (i.e., the read address counter was incremented), the resulting equality of the read and write address counters indicates a FIFO EMPTY condition. Conversely, if a write operation was performed (i.e., the write address counter was incremented), the resulting equality of the read and write address counters indicates a FIFO FULL condition. However, determining the type of operation that caused the contents of the read and write address counters to match can become complicated, particularly when the read and write address counters are clocked asynchronously.

Another prior art system subtracts the contents of the read and write address counters to determine when the read address is within one address of catching up to the write address and when the write address is within one address of catching up to the read address. Again, the subtraction circuitry for such a system is unreliable when the read and write address counters are clocked asynchronously.

Yet another prior art system, disclosed in co-owned U.S. Pat. No. 5,898,893, includes a direction circuit and a control circuit for generating FIFO FULL and FIFO EMPTY command signals. (U.S. Pat. No. 5,898,893 is hereby incorporated by reference.) The circular sequences of the write address and read address are divided into segments, and portions of the write address and read address are encoded to indicate the segments in which the current read address and current write address are located within their respective circular sequences. The direction circuit is connected to receive the encoded portions of the read and write addresses. In response, the direction circuit generates a DIRECTION signal that is set to a first state when the read address is in the segment prior to the segment of the write address, and is set to a second state when the write address is in the segment prior to the segment of the read address. The DIRECTION signal is used to determine whether the FIFO memory is empty or full when the read address equals the write address.

In addition to FIFO FULL and FIFO EMPTY conditions, it is also valuable for a FIFO memory system to generate status information regarding the amount of occupied memory at any point in time. For example, some users require status information to control burst read or write operations when the memory is half-full or half-empty. Such status information is relatively easy to obtain in synchronous systems by subtracting a currently-generated binary read address signal from a currently-generated binary write address signal. However, status information is much more difficult to obtain in asynchronous FIFO memory systems because of the danger of "glitches" (i.e., momentary erroneous values produced when an address counter increments from an initial value to a next-sequential value). Because the read and write clock signals are asynchronous, if the subtraction operation is clocked by the write clock signal, there is a danger that glitches in the read address can produce erroneous subtraction results. Conversely, if the subtraction operation is clocked by the read clock signal, there is a danger of glitches in the write address at the moment that the subtraction operation is performed.

Status information can be derived in an asynchronous system using the encoded portions of the write address and read address taught in co-owned U.S. Pat. No. 5,898,893, but this derived status information would be inaccurate and unreliable under certain conditions, and therefore not very useful to a user under those conditions.

It would therefore be desirable to have a reliable structure and method for detecting full and empty conditions of a FIFO that overcome the problems associated with the conventional structures, described above. It would also be desirable to have a reliable and accurate structure and method for determining the amount of data stored in asynchronous FIFO memories.

SUMMARY OF THE INVENTION

The present invention provides a reliable and robust structure and method for controlling an asynchronous FIFO memory system, and for accurately determining the amount of data stored in the FIFO memory system. Unlike prior art FIFO memory systems, the present invention sacrifices one memory location to simplify the full/empty determination process (i.e., a FULL control signal is generated when the current binary write address is one memory location behind the current binary read address, thereby preventing the write address counter from "catching up" to the read address counter). In addition, unlike prior art asynchronous FIFO memory systems, the present invention provides accurate information regarding the amount of data currently stored in the FIFO memory by synchronizing a current read address to the write clock, thereby providing reliable information that can be used to determine the current capacity of the FIFO memory without the danger of errors caused by glitches.

The present FIFO memory system includes a memory, a write address counter, a read address counter, a flag control circuit for generating FULL and EMPTY command signals, and an optional status control circuit for generating a FIFO status signal indicating the amount of data stored in the FIFO memory at a given moment during operation. The write address counter and read address counter generate an incrementing binary write address and an incrementing binary read address, respectively, that change in accordance with a predetermined circular binary counting sequence. A currently-generated binary write address signal is transmitted to the memory under the control of a WRITE_ALLOW control signal and a write clock signal during write operations, and a currently-generated binary read address is transmitted to the memory under the control of a READ_ALLOW control signal and a read clock signal during read operations. The WRITE_ALLOW and READ_ALLOW control signals are generated based on the FULL and EMPTY control signals generated by the flag control circuit.

In accordance with a first aspect of the present invention, the flag control circuit includes a read address register section, a write address register section, and a comparator circuit. The read address register section includes a binary-to-Gray-code converter for converting the current binary read address generated by the read address counter into a series of sequential Gray-code read address values that include a next-to-be-used read address value, a current read address value, and a last-used read address value. Similarly, the write address register includes a binary-to-Gray-code converter for converting the current binary write address generated by the write address counter into a series of sequential Gray-code write address values that include a next-to-be-used write address value and a current write address value. The comparator circuit compares selected pairs of Gray-code read address values and Gray-code write address values, and generates the FULL and EMPTY control signals based on these comparisons. In particular, the comparator circuit generates the EMPTY control signal when the current write address value is equal to the current read address value. In contrast, the comparator circuit generates the FULL control signal when the current write address value is equal to the last-used read address value, thereby preventing the write address counter from "catching up" to the read address counter. By preventing the write address counter from "catching up" to the read address counter, the determination of the FULL and EMPTY conditions is greatly simplified, thereby providing a reliable and robust structure and method for controlling a FIFO memory system.

In accordance with a second aspect of the present invention, a status control circuit synchronizes the current binary read address generated by the read address counter to the write clock, and then subtracts the write-synchronized binary read address from the current binary write address to determine the amount of data stored in the memory. The status control circuit includes a binary-to-Gray-code converter for converting the binary read address to a Gray-code read address, a write-synchronization register for synchronizing the Gray-code read address to the write clock, a Gray-code-to-binary converter for reconverting the Gray-code read address to form the write-synchronized binary read address, and a subtractor for determining a difference between the binary write address received from the write address counter and the write-synchronized binary read address. By generating the write-synchronized read address in binary form, the difference between the currently-generated binary read and write addresses is readily determined, thereby providing an accurate indication of the amount of data stored in the memory. By converting the addresses to Gray-code format (in which only one bit changes between successive count values) the values can be compared without generating glitches in the comparison results.

The present FIFO memory system can be implemented, e.g., by a field programmable gate array or any other type of integrated circuit chip.

BRIEF DESCRIPTION OF THE DRAWINGS

These and other features, aspects and advantages of the present invention will become better understood with regard to the following description, appended claims, and accompanying drawings, where:

DETAILED DESCRIPTION OF THE DRAWINGS

System Overview

Figure 1:
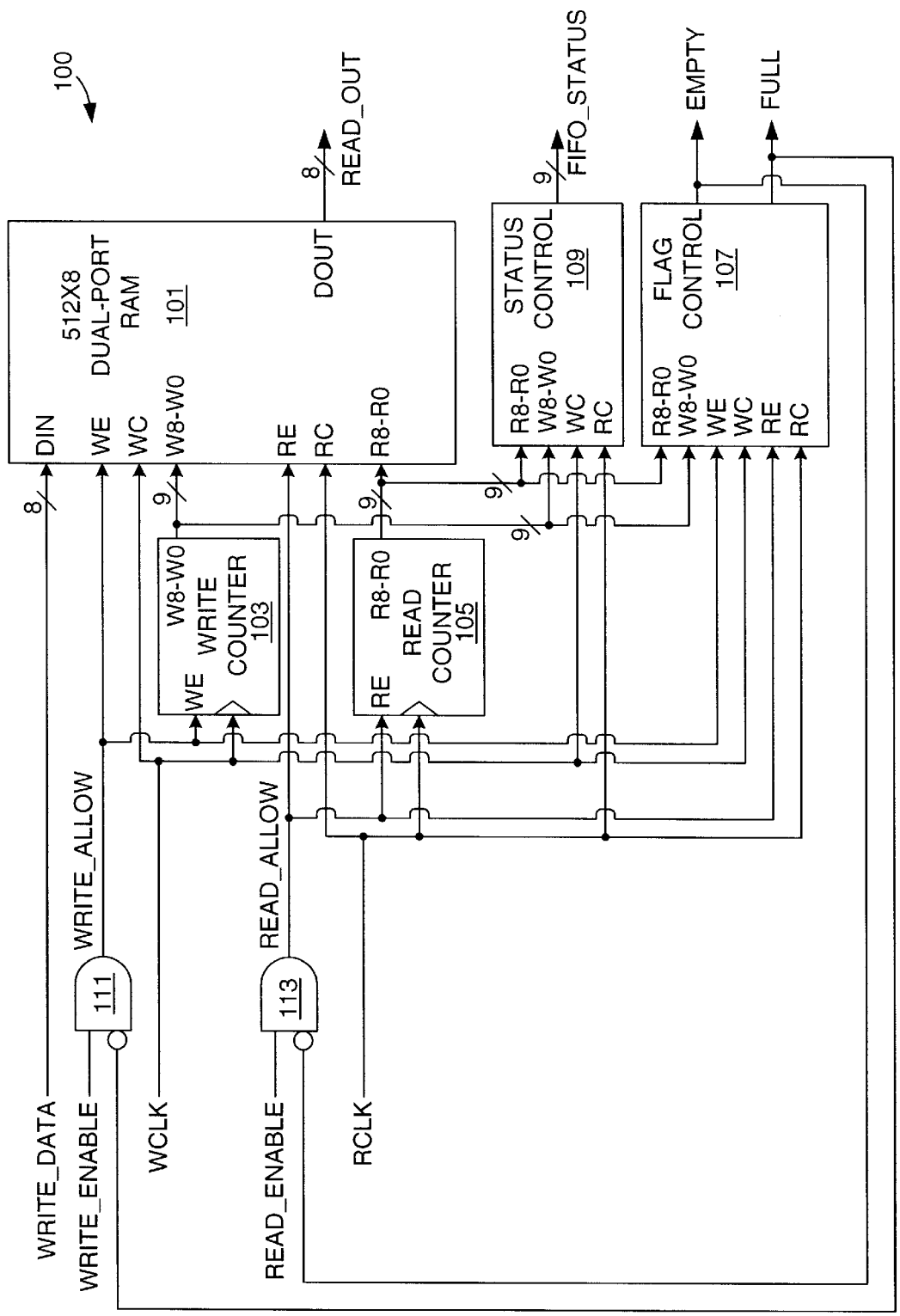
FIG. 1 is a block diagram showing a FIFO memory system according to the present invention.

FIG. 1 is a block diagram of a FIFO memory system 100 in accordance with one embodiment of the invention. FIFO memory system 100 includes a 512×8 bit dual-port FIFO RAM (herein referred to as "memory") 101, a 9-bit write address counter (WRITE COUNTER) 103, a 9-bit read address counter (READ COUNTER) 105, a flag control circuit 107, and an optional status control circuit 109.

Memory 101 is consistent with conventional dual-port RAM circuits, which are well known. Memory 101 is controlled by a WRITE_ALLOW signal that is applied to its write enable (WE) terminal, a write clock (WCLK) signal applied to its write clock (WC) terminal, a READ_ALLOW signal applied to its read enable (RE) terminal, and a read clock (RCLK) signal applied to its read clock (RC) terminal. In addition, memory 101 receives a 9-bit binary write address W8–W0 from write address counter 103, and a 9-bit binary read address R8–R0 from read address counter 105. During write operations, the WRITE_ALLOW signal is generated by a first AND gate 111 in response to an externally generated WRITE_ENABLE input signal and an inverted FULL control signal (which FULL control signal is generated by flag control circuit 107, described below). Memory 101 stores an 8bit WRITE_DATA value applied at its data in (DIN) port in a memory location identified by binary write address W8–W0 when the WRITE_ALLOW signal is asserted (i.e., when the WRITE_ENABLE signal is high and the FULL control signal is low). In contrast, data signals received at the DIN port of memory 101 are ignored when the WRITE_ALLOW signal is de-asserted (i.e., when either the FULL control signal is high or the WRITE_ENABLE signal is de-asserted). Similarly, during read operations, the READ_ALLOW signal is generated by a second AND gate 113 in response to an externally generated READ_ENABLE input signal and an inverted EMPTY control signal, which EMPTY control signal is also generated by flag control circuit 107. Memory 101 transmits an 8-bit word from the memory location identified by binary read address R8–R0 through its data output (DOUT) port when the READ_ALLOW signal is asserted (i.e., when the READ_ENABLE signal is high and the EMPTY control signal is low). In contrast, the binary read address R8–R0 is ignored by memory 101 when the READ_ALLOW signal is de-asserted (i.e., when either the EMPTY control signal is high or the READ_ENABLE signal is low).

Write address counter 103 and read address counter 105 are consistent with conventional circular binary counters, which are well known. Write address counter 103 is controlled by the WRITE_ALLOW control signal that is applied to its write enable (WE) terminal, and receives the WCLK clock signal at its clock input terminal. Similarly, read address counter 105 is controlled by the READ_ALLOW control signal that is applied to its read enable (RE) terminal, and receives the RCLK clock signal at its clock input terminal. Both write address counter 103 and read address counter 105 generate address signals that follow the same circular binary counting sequence (i.e., 000000000 to binary 111111111 in the disclosed embodiment). Reset circuitry (not shown) is provided to synchronize both counters when FIFO memory system 100 is initialized.

Flag control circuit 107 generates the FULL and EMPTY control signals by converting the currently-generated binary read and write address signals into Gray-code address values, and then comparing the Gray-code address values to determine whether memory 101 is "full" (i.e., a maximum allowable amount of data is stored in memory 101) or "empty" (no valid data is stored in memory 101). In accordance with a first aspect of the present invention, the "full" condition is met when the binary write address is one memory location behind the binary read address. That is, unlike prior art FIFO memory systems in which equal binary write and read addresses indicate either "empty" or "full" memories, the binary write and read addresses are only allowed to be equal when memory 101 is "empty". By preventing the write address counter from "catching up" to the read address counter, the logic circuitry needed to detect the "full" and "empty" conditions of memory 101 is optimized over that used in prior art FIFO memory systems. A downside to this arrangement is that one memory location is sacrificed in the binary counting sequence (i.e., only 511 memory locations of 512×8 dual-port RAM contain data when memory 101 is "full"). However, this downside is greatly outweighed by the speed of the "FULL" and "EMPTY" control signal generation circuitry, discussed below, that provides a significant advantage of FIFO memory system 100 over prior art systems. In addition, Gray-coding ensures that each time write address counter 103 changes state, only one bit of the write address value stored in flag control circuit 107 changes state. Similarly, each time read address counter 105 changes state, only one bit of the Gray-code read address value stored in flag control circuit 107 changes state. This implementation prevents decoding glitches within flag control circuit 107.

In accordance with a second aspect of the present invention, status control circuit 109 generates accurate status information regarding the amount of data stored in memory 101 at a given moment by synchronizing the binary read address to the WCLK (write) clock signal, and then determining a difference between the current binary write address and the write-synchronized binary read address. The synchronization process is performed by converting the current binary read address into a Gray-code read address value, then synchronizing the Gray-code read address value to the WCLK (write) clock signal, and then reconverting the Gray-code read address value to form the write-synchronized binary read address. Similar to its use in flag control circuit 107, Gray-coding is used to ensure that each time read address counter 105 is incremented, only one bit of the read address value stored in status control circuit 109 is incremented, thereby avoiding decoding glitches during re-conversion to binary. Details regarding the circuitry used to perform the write synchronization process are provided below. After the write-synchronized binary read address is formed, it is then subtracted from the binary write address, thereby providing a fast and accurate indication of the amount of data stored in memory 101.

In one embodiment, FIFO memory circuit 100 is implemented by a field programmable gate array (FPGA). For example, FIFO memory 101 can be implemented using a Block RAM (BRAM) memory circuit provided in Xilinx's Virtex™ FPGA, which is described in The Programmable Logic Data Book, 1999 (pages 3-1 through 3-22), hereby incorporated by reference. ("Virtex" is a trademark of Xilinx, Inc., of San Jose, Calif.) Each Block RAM circuit operates in a manner consistent with conventional dual-port RAM circuits, and is therefore not described in additional detail herein. Write address counter 103 and read address counter 105 are implemented using known techniques in the configurable logic blocks (CLBs) also provided on Virtex FPGAs. Flag control circuit 107 and status control circuit 109, which are described in detail below, are also implemented in the CLBs of Virtex FPGAs. In alternative embodiments (not shown), memory system 100 is implemented using a programmable logic device other than a Virtex FPGA, or is fabricated as an application specific integrated circuit (ASIC) device or a custom integrated circuit. In such an embodiment, memory 101 can be implemented as a standard dual-port memory, and the remaining circuitry of memory system 100 can be fabricated using circuitry consistent with that disclosed below.

Flag Control Circuit

Figure 2:
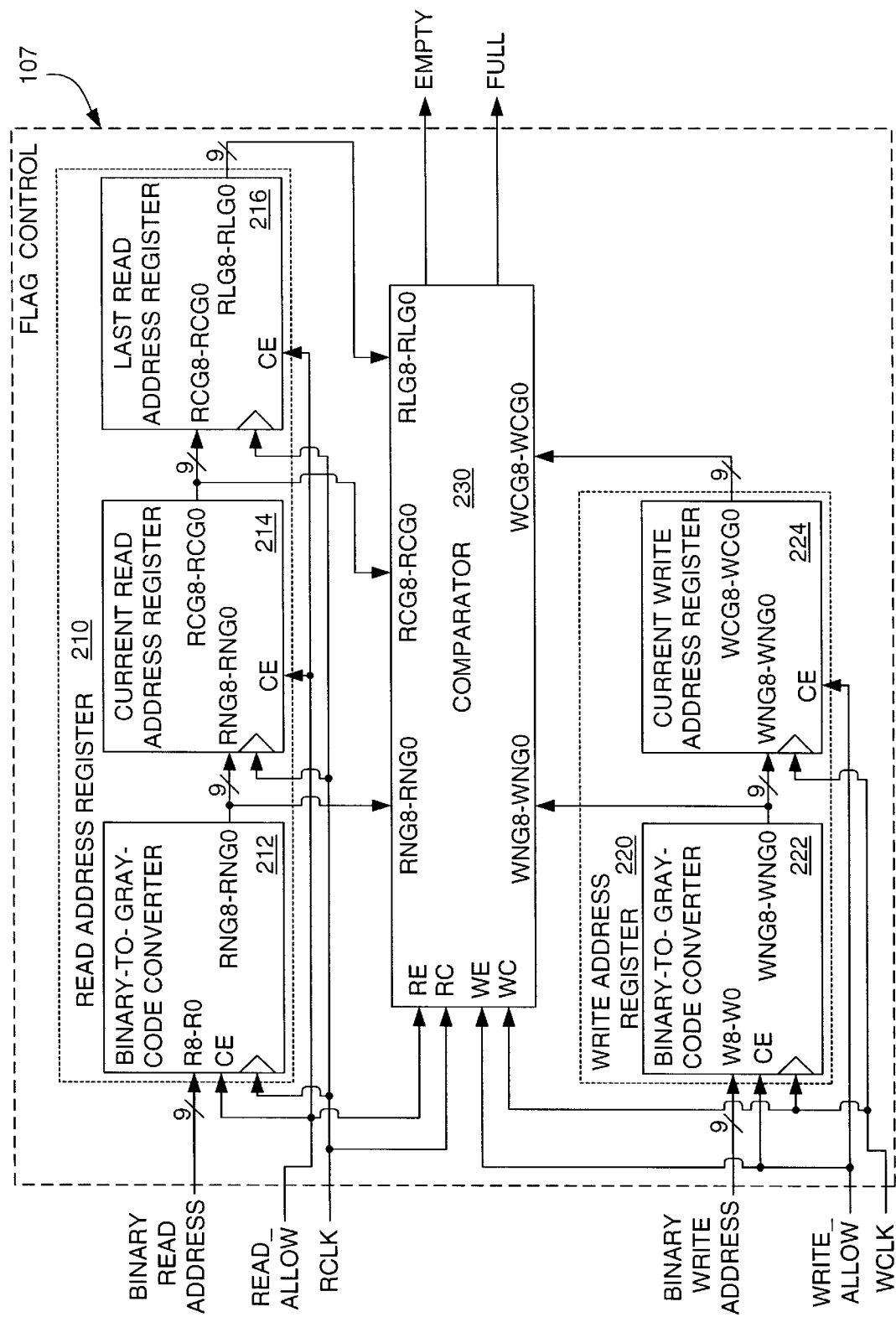
FIG. 2 is a block diagram showing a flag control circuit of the FIFO system shown in FIG. 1.

FIG. 2 is a block diagram showing flag control circuit 107 in additional detail. Flag control circuit 107 is generally divided into a read address register section 210, a write address register section 220, and a comparator circuit 230.

Read address register section 210 converts the binary read address R8–R0 into three sequential Gray-code read address values (a next-to-be-used read address value, a current read address value, and a last-used read address value). Read address register section 210 includes a binary-to-Gray-code converter 212, a current read address register circuit 214, and a last read address register circuit 216. Binary-to-Gray-code converter 212 converts the binary read address R–R0 into the next-to-be-used Gray-code read address value RNG8–RNG0 that is transmitted to current read address register circuit 214 and comparator circuit 230. Note that the next-to-be-used read address value RNG8–RNG0 is generated in accordance with the READ_ALLOW control and RCLK clock signals, and therefore corresponds to a first (next-to-be-used) read operation. Current read address register circuit 214 receives the next-to-be-used Gray-code read address value RNG8–RNG0 and, also in accordance with the READ_ALLOW control and RCLK clock signals, stores this data as the current read address value RCG8–RCG0 that is transmitted to last read address register circuit 216 and comparator circuit 230. Note that the current read address value RCG8–RCG0 is one read operation behind (i.e., older than) next-to-be-used read address value RNG8–RNG0. Finally, last read address register circuit 216 receives the current read address value RCG8–RCG0 and, also in accordance with the READ_ALLOW control and RCLK clock signals, stores this data as the last-used read address value RLG8–RLG0 that is transmitted to comparator circuit 230. Note that the last-used read address value RLG8–RLG0 is one read operation behind current read address value RCG8–RCG0, and is two read operations behind next-to-be-used read address value RNG8–RNG0.

Write address register section 220 converts the binary write address W8–W0 into two sequential Gray-code write address values (a next-to-be-used write address value and a current write address value). Write address register section 220 includes a binary-to-Gray-code converter 222 and a current write address register circuit 224. Binary-to-Gray-code converter 222 converts the binary write address W8–W0 into the next-to-be-used Gray-code write address value WNG8–WNG0 that is transmitted to current write address register circuit 224 and comparator circuit 230. Note that the next-to-be-used write address value WNG8–WNG0 is generated in accordance with the WRITE_ALLOW control and WCLK clock signals, and therefore corresponds to a first (next-to-be-used) write operation. Current write address register circuit 224 receives the next-to-be-used Gray-code write address value WNG8–WNG0 and, also in accordance with the WRITE_ALLOW control and RCLK clock signals, stores this data as the current write address value RCG8–RCG0 that is transmitted to comparator circuit 230. Note that the current write address value WCG8–RCG0 is one write operation behind next-to-be-used write address value WNG8–WNG0.

Comparator circuit 230 receives the three Gray-code read address values from read address register section 210, the two Gray-code write address values from write address register section 220, the RCLK and WCLK clock signals, and the READ_ALLOW and WRITE_ALLOW control signals, and generates the FULL and EMPTY control signals when predetermined conditions are met by these signals.

Similar to prior art FIFO memory systems, comparator circuit 230 detects an "empty" condition when the current write address value WCG8–WCG0 is equal to the current read address value RCG8–RCG0, thereby indicating that the binary write address currently generated by write address counter 103 is equal to the binary read address currently generated by read address counter 105. Under this condition, the EMPTY control signal is asserted (driven high) by comparator circuit 230 to prevent subsequent read operations.

In addition to the "empty" condition, in accordance with another aspect of the present invention, comparator circuit 230 detects an "almost empty" condition when one data word remains in memory 101 and a read operation is about to be performed. In one embodiment, this "almost empty" condition is detected when the current write address value WCG8–WCG0 is equal to the next-to-be-used read address value RNG8–RNG0 while the READ_ALLOW control signal is high. In the "almost empty" condition, an intermediate "almost empty" signal is generated within comparator circuit 230 that forces a high EMPTY control signal immediately after the next read cycle, i.e., after memory 101 enters the "empty" condition. Because the EMPTY control signal is generated immediately after memory 101 enters the "empty" condition, read operations are prevented from occurring after all data values are read from memory 101. These superfluous read operations require discrimination circuitry in prior art systems that is not required by the present invention.

Similar to the "almost empty" condition, comparator 230 detects an "almost full" condition when two empty memory locations remain in memory 101 and a write operation is about to be performed. In one embodiment, this "almost full" condition is detected when the next-to-be-used write address value WNG8–WNG0 is equal to the last-used read address value RLG8–RLG0 and the WRITE_ALLOW control signal is currently high. In the "almost full" condition, an intermediate "almost full" signal is generated within comparator circuit 230 that forces a high FULL control signal immediately after the next write cycle, i.e., when memory 101 enters the "full" condition (discussed below). Because the FULL control signal is generated immediately after memory 101 enters the "full" condition, write operations are prevented from occurring after data is written to the last available memory location of memory 101. These superfluous write operations require discrimination circuitry in prior art systems that is not required by the present invention.

Finally, comparator 230 generates a high FULL control signal to prevent subsequent write operations when the current write address value WCG8–WCG0 is equal to the last-used read address value RLG8–RLG0 (indicating that write address counter 103 is one increment away from generating the same binary address as that currently generated by read address counter 105). As mentioned above, because the FULL control signal is asserted to prevent the binary write address signal generated by write address counter 103 from "catching up" (equaling) the binary read address signal generated by read address counter 105, one memory location in memory 101 is effectively sacrificed (e.g., the effective capacity of the 512×8 dual-port RAM utilized as memory 101, shown in FIG. 1, is 511 bytes).

However, the sacrifice of one memory location is deemed acceptable because the resulting circuitry of flag control circuit 107 (described in detail below) is fast, reliable and robust.

Read address register section 210, write address register section 220, and comparator circuit 230 are described in additional detail in the following paragraphs that refer to FIGS. 3 through 5(B).

Figure 3:
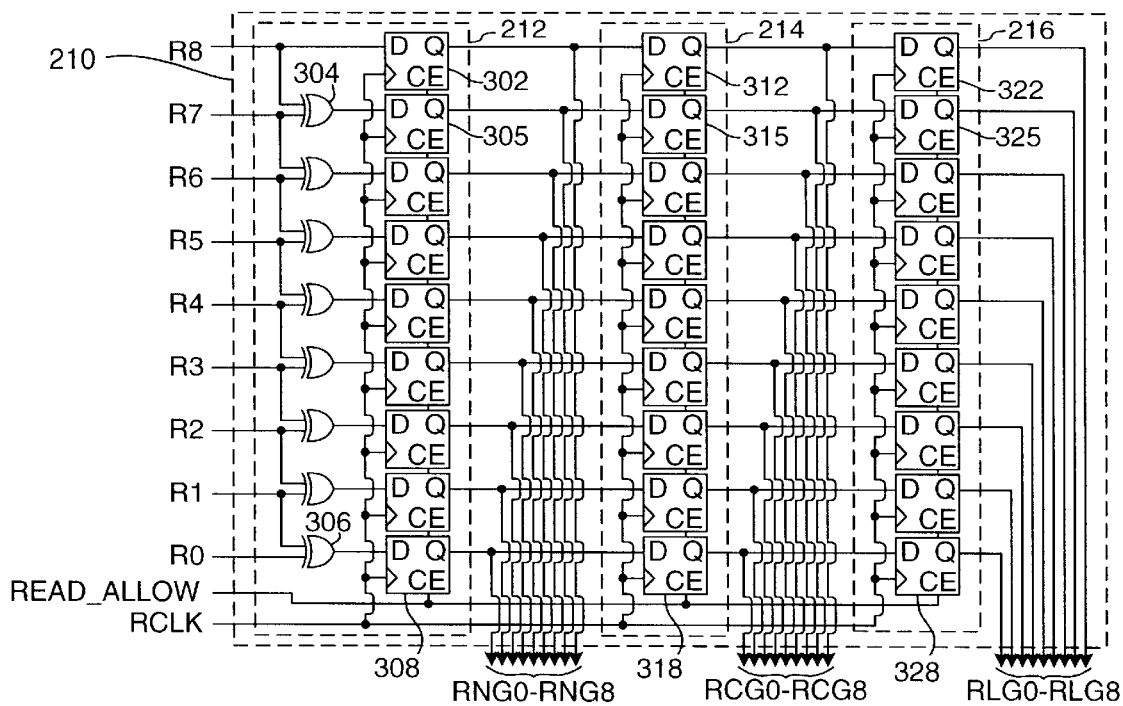
FIG. 3 is a simplified circuit diagram showing a read address register section of the flag control circuit of FIG. 2.

FIG. 3 is a circuit diagram showing read address register section 210 in accordance with one embodiment of the present invention. Specifically, FIG. 3 shows additional details associated with binary-to-Gray-code converter 212, current read address register circuit 214, and last read address register circuit 216, which are described in the following paragraphs.

Binary-to-Gray-code converter 212 includes logic for converting binary read address signals R8–R0 into a nine-bit next-to-be-used Gray-code read address value, and nine parallel registers (e.g., D flip-flops) for storing the next-to-be-used Gray-code read address value. Each of the nine parallel registers includes a data (D) input terminal, a data (Q) output terminal, a clock terminal, and a clock enable (CE) terminal. The READ_ALLOW control signal is applied to the CE terminal of each of the nine registers, and a data value applied to the D input terminal of each register is stored at the rising edge of the RCLK clock signal when the READ_ALLOW control signal is asserted. Binary-to-Gray-code conversion is executed by passing a most significant bit R8 of the current binary read address signal R8–R0 to a first register 302, and using exclusive-OR (XOR) logic gates to operate on selected pairs of current binary read address signal R8–R0 to generate the remaining eight Gray-code address bit values that are stored in the remaining parallel registers in the manner shown in FIG. 3. For example, bits R8 and R7 of the current binary read address signal are applied to the input terminals of XOR gate 304, whose output signal is transmitted to the D input terminal of register 305. Bit pairs R7 and R6, R6 and R5, R5 and R4, R4 and R3, R3 and R2, and R2 and R1 are similarly XORed together and applied to the D input terminals of associated registers. Finally, bit pair R1 and R0 are applied to the input terminals of a last XOR gate 306, whose output terminal is connected to the D input terminal of a last register 308. Many other circuits can also be used to generate sequences that follow a Gray code counting cycle. Therefore, the appended claims are not necessarily restricted to the specific XOR arrangement shown in FIG. 3.

The nine parallel registers of binary-to-Gray-code converter 212 store the next-to-be-used read address value RNG8–RNG0 during each read operation. Specifically, in response to a high READ_ALLOW control signal, read address counter 105 (see FIGS. 1 and 2) generates a current binary read address R8–R0 that is applied to memory 101 and to flag control circuit 107. The high READ_ALLOW control signal also enables the nine parallel registers of binary-to-Gray-code converter 212, thereby causing the nine parallel registers to capture the Gray-code conversion of the current binary read address during a first cycle of the RCLK clock signal. This Gray-code conversion is then transmitted from the Q output terminals of the nine parallel registers as the next-to-be-used Gray-code read address value RNG0–RNG8, which is transmitted both to comparator circuit 230 and to current read address register circuit 214.

Note that, as used herein, "last-used", "current" and "next-to-be-used" are terms that denote the relative values of three consecutive binary addresses, and do not necessarily indicate a direct conversion of binary addresses to Gray-code address values. In other words, the Gray-code address value generated by binary-to-Gray-code converter 212 is technically a conversion of the current binary read address transmitted from read address counter 105, not the next-sequential binary read address that will be generated by read address counter 105 (i.e., according to the circular binary counting sequence utilized by read address counter 105). However, because the flag control circuit only compares the Gray-code read and write address values, the relationship of the Gray-code values stored in read address register section 210 and write address register section 220 to the binary addresses generated by read address counter 105 and write address counter 103 is not important. What is important is that the Gray-code values stored in read address register section 210 and write address register section 220 are applied consistently in the FULL/EMPTY determination process.

Current read address register circuit 214 receives the next-to-be-used read address value RNG8–RNG0, and includes nine parallel registers for storing the current Gray-code read address value RCG8–RCG0. The nine parallel registers are essentially identical to those used in binary-to-Gray-code converter 212. Note that the address value stored in the parallel registers of current read address register circuit 214 is one read operation behind the next-to-be-used read address value RNG8–RNG0. Specifically, bit RNG8 of the next-to-be-used read address signal value RNG8–RNG0 is latched into a first register 312 of current read address register circuit 214 one RCLK clock cycle after it is stored in register 302 of binary-to-Gray-code converter 212. Similarly, bit RNG7 of the next-to-be-used read address signal value RNG8–RNG0 is latched into a register 315 of current read address register circuit 214 one RCLK clock cycle after it is stored in register 305 of binary-to-Gray-code converter 212, and bit RNG0 of the next read address signal value RNG8–RNG0 is latched into a register 318 one RCLK clock cycle after it is stored in register 308. The current read address value RCG0–RCG8 is then transmitted from the Q output terminals of the nine parallel registers to comparator circuit 230 and to last read address register circuit 216.

Last read address register circuit 216 receives the current address value RCG8–RCG0 from current read address register circuit 214, and includes nine parallel registers for storing the last-used Gray-code read address value RLG8–RLG0. The nine parallel registers are essentially identical to those used in binary-to-Gray-code converter 212 and current read address register circuit 214. Note that the address value stored in the parallel registers of last read address register circuit 216 is one read operation behind the current read address value RCG8–RCG0, and two read operations behind the next-to-be-used read address value RNG8–RNG0. Specifically, bit RCG8 of the current address signal value RCG8–RCG0 is latched into a first register 322 of last read address register circuit 216 one RCLK clock cycle after it is stored in register 312 of current read address register circuit 214. Similarly, bit RCG7 of the current read address signal value RCG8–RCG0 is latched into a register 325 of last read address register circuit 216 one RCLK clock cycle after it is stored in register 315 of current read address register circuit 214, and bit RCG0 of the current read address signal value RCG8–RCG0 is latched into a register 328 of last read address register circuit 216 one RCLK clock cycle after it is stored in register 318 of current read address register circuit 214. The last-used read address value RLG0–RLG8 is then transmitted from the Q output terminals of the nine parallel registers to comparator circuit 230.

Figure 4:
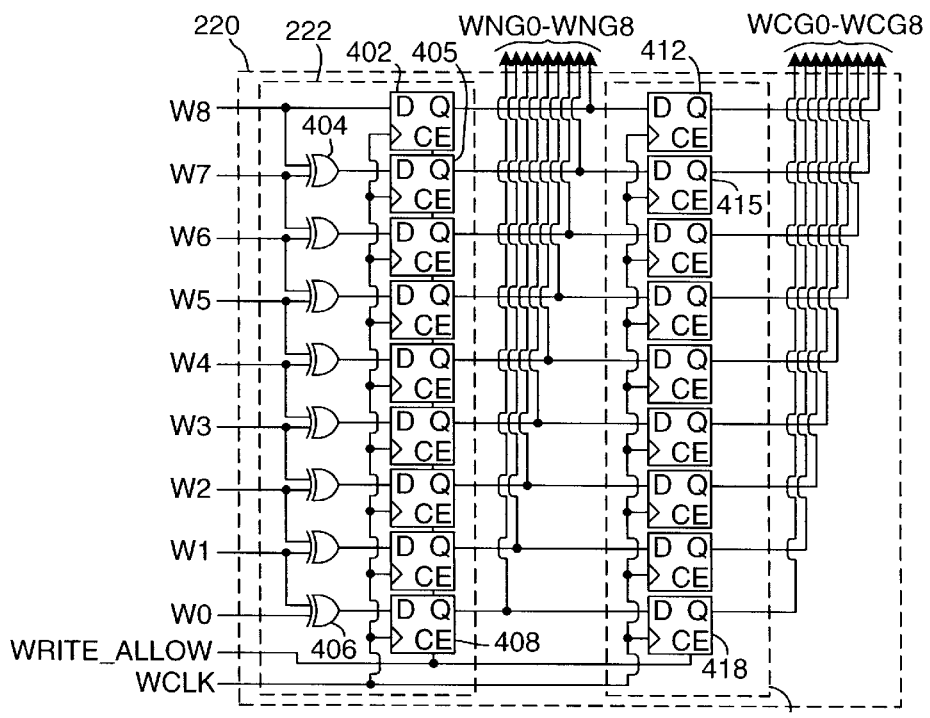
FIG. 4 is a simplified circuit diagram showing a write address register section of the flag control circuit of FIG. 2.

FIG. 4 is a circuit diagram showing write address register section 220 in accordance with an embodiment of the present invention. Specifically, FIG. 4 shows additional details associated with binary-to-Gray-code converter 222 and current write address register circuit 224, which are described in the following paragraphs.

Binary-to-Gray-code converter 222 includes logic for converting binary write address signals W8–W0 into a nine-bit next-to-be-used Gray-code write address value, and nine parallel registers (e.g., D flip-flops) for storing the next-to-be-used Gray-code write address value. The WRITE_ALLOW control signal is applied to the clock enable (CE) terminal of each of the nine registers, and a data value applied to the D input terminal of each register is stored at the rising edge of the WCLK (write) clock signal when the WRITE_ALLOW control signal is asserted. The binary-to-Gray-code conversion is executed by passing a most significant bit W8 of the current binary write address signal W8–W0 to a first register 402, and using XOR logic gates to operate on selected pairs of current binary write address signal W8–W0 to generate the remaining eight Gray-code address bit values that are stored in the remaining parallel registers in the manner shown in FIG. 4. For example, bits W8 and W7 of the current binary write address signal are applied to the input terminals of XOR gate 404, whose output signal is transmitted to the D input terminal of register 405. Bit pairs W7 and W6, W6 and W5, W5 and W4, W4 and W3, W3 and W2, and W2 and W1 are similarly XORed together and applied to associated registers. Finally, bit pair W1 and W0 are applied to the input terminals of a last XOR gate 406 whose output terminal is connected to the D input terminal of a last register 408. Note that the binary-to-Gray-code conversion circuitry utilized in binary-to-Gray-code converter 222 is not restricted to that specifically shown in FIG. 4, but must be consistent with that used in read address register section 210 (described above).

Binary-to-Gray-code converter 222 stores the next-to-be-used write address value WNG8–WNG0 during each write operation. Specifically, in response to a high WRITE_ALLOW control signal, write address counter 103 (see FIGS. 1 and 2) generates a current binary write address that is applied to memory 101 and to flag control circuit 107. The high WRITE_ALLOW control signal also enables the nine parallel registers of binary-to-Gray-code converter 222, thereby causing the nine parallel registers to capture the Gray-code conversion of the current binary write address during a first cycle of the WCLK clock signal. This Gray-code conversion is then transmitted from the Q output terminals of the nine parallel registers as the next-to-be-used Gray-code write address value WNG0–WNG8, which is transmitted both to comparator circuit 230 and to current write address register circuit 224.

Current write address register circuit 224 receives the next-to-be-used write address value WNG8–WNG0, and includes nine parallel registers for storing the current Gray-code write address value WCG8–WCG0. The nine parallel registers are essentially identical to those used in binary-to-Gray-code converter 222, and current write address register circuit 224 operates in a manner similar to that described above with reference to current read address register circuit 214. Note that the address value stored in the parallel registers of current write address register circuit 224 is one write operation behind the next-to-be-used write address value WNG8–WNG0. The current write address value WCG0–WCG8 is transmitted from the Q output terminals of the nine parallel registers to comparator circuit 230.

At reset, initial Gray-code address values are stored in the various registers of read address register section 210 and write address register section 220 to prevent errors from occurring before actual address values are shifted into these sections. For example, as discussed above, the last-used Gray-code read address value RLG8–RLG0 is one read operation behind the current Gray-code address value RCG8–RCG0, and two read operations behind next-to-be-used Gray-code read address values RNG8–RNG0. To ensure that this sequence is established at reset, initial Gray-code values are written to the registers (flip-flops) of binary-to-Gray-code converter 212, current read address register circuit 214, and last-used read address register circuit 216 that are sequential (i.e., according to the Gray-code counting sequence). In addition, these initial Gray-code address values must correspond to binary addresses that are behind the initial binary address (i.e., 000000000 for this embodiment) in the binary counting sequence. Specifically, binary-to-Gray-code converter 212 is initialized to the Gray-code equivalent of the binary address that immediately precedes the initial binary read address. For example, the binary address immediately preceding binary address 000000000 is 111111111, so the Gray-code equivalent of this address (e.g., 100000000) is stored in binary-to-Gray-code converter 212. Similarly, current read address register circuit 214 is initialized to the Gray-code equivalent of binary 111111110 (e.g., 100000001), and last-used read address register circuit 216 is initialized to the Gray-code equivalent of binary 111111101 (e.g., 100000011). Accordingly, when the initial binary read address 000000000 is converted and stored in binary-to-Gray-code converter 212 at reset, the initial Gray-code equivalent stored in binary-to-Gray-code converter 212 is shifted to current read address register circuit 214, and the initial Gray-code equivalent stored in read address register circuit 214 is shifted to last-used read address register circuit 216. Write address register section 220 is initialized using similar Gray-code address values, thereby providing accurate data for identifying "full" and "empty" conditions immediately after a reset operation.

Figure 5A:
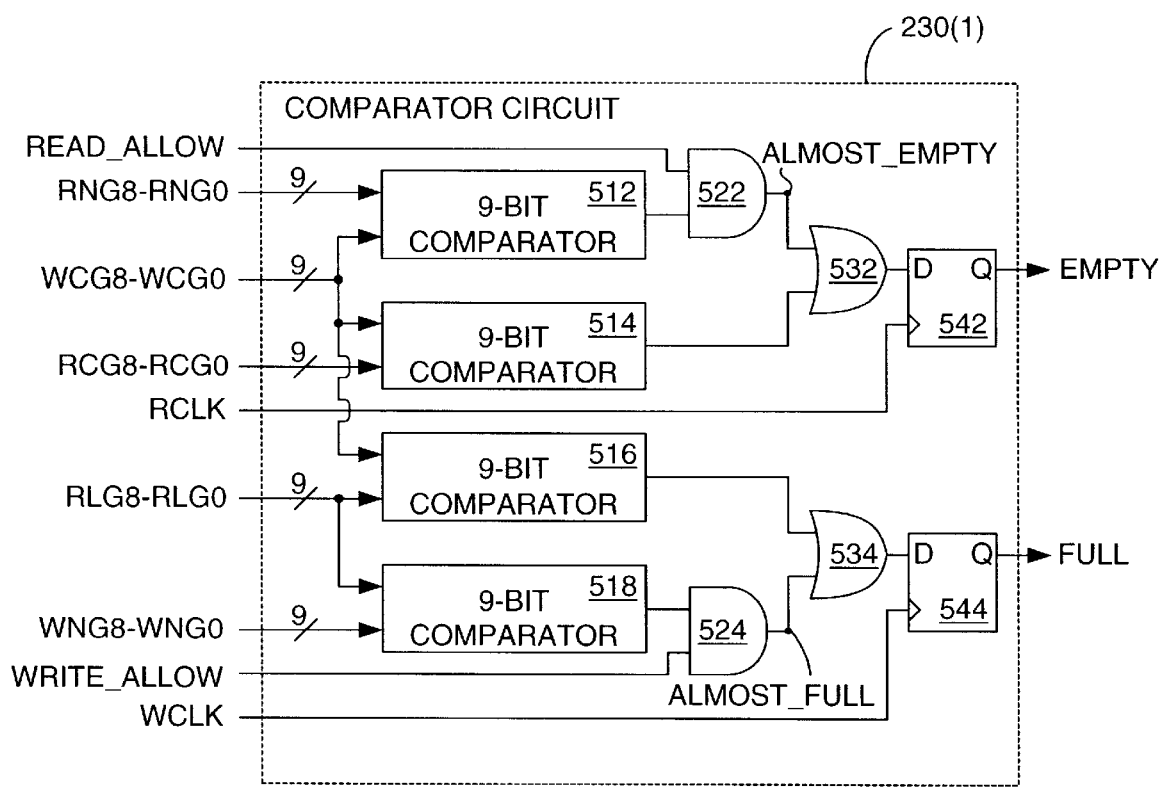
FIGS. 5(A) and 5(B) are simplified circuit diagrams showing comparator circuits of the flag control circuit of FIG. 2 in accordance with alternative embodiments of the present invention.
Figure 5B:
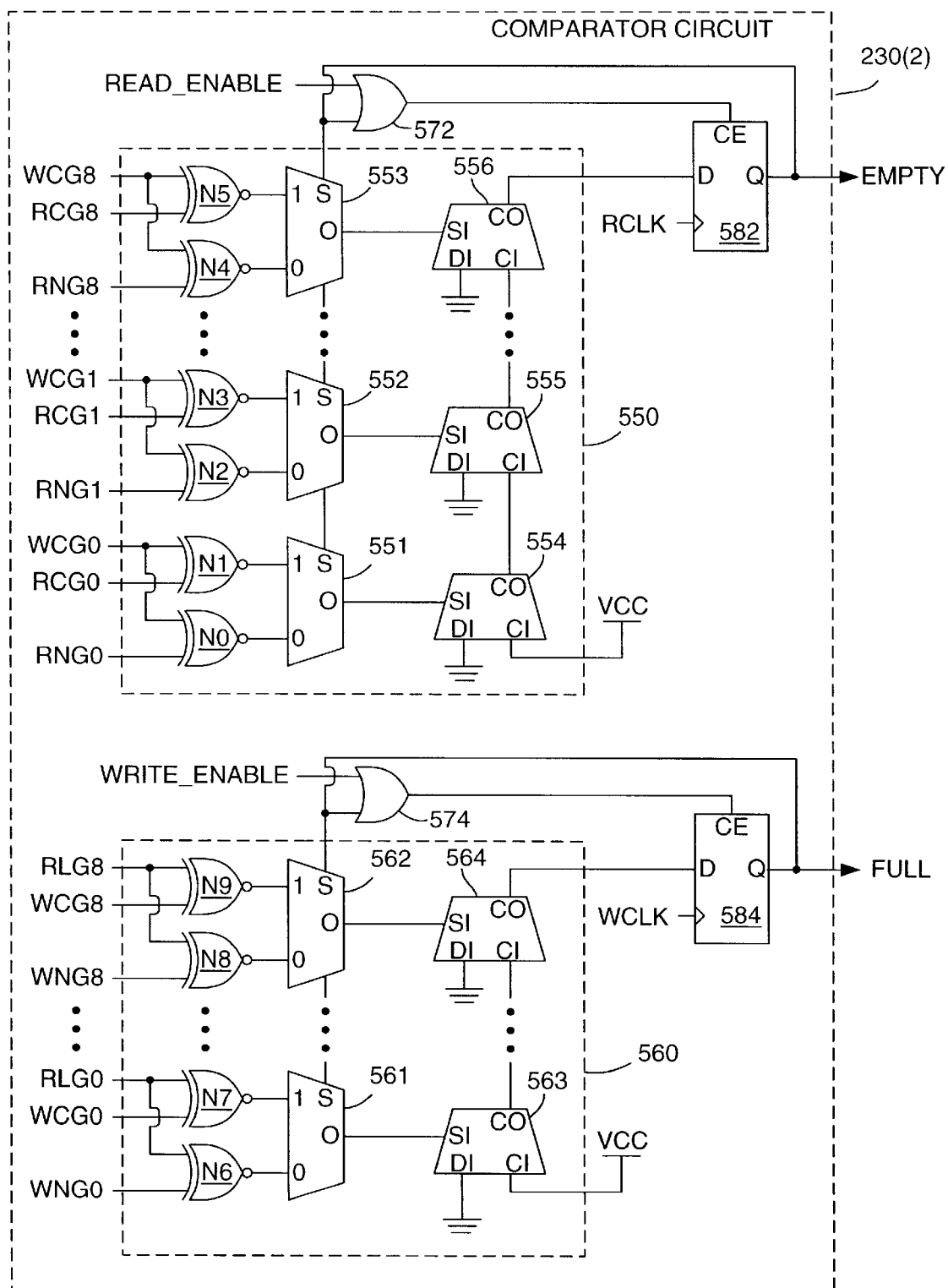

FIGS. 5(A) and 5(B) illustrate alternative embodiments of comparator circuit 230 (shown in FIG. 2).

FIG. 5(A) is a block diagram showing comparator circuit 230(1) in accordance with an embodiment of the present invention. Comparator 230(1) includes four 9-bit comparators 512, 514, 516, and 518, two logic AND gates 522 and 524, two logic OR gates 532 and 534, and two registers (flip-flops) 542 and 544.

Each 9-bit comparator 512, 514, 516, and 518 is implemented using well-known circuitry to receive two selected nine-bit Gray-code address values, and to generate a high (logic 1) output signal when the two selected nine-bit Gray code address values are equal (a logic low output signal is generated when the two nine-bit values are not equal). Comparator 512 receives next-to-be-used read address value RNG8–RNG0 and current write address value WCG8–WCG0, and generates a high output signal when these two Gray-code address values are equal. Similarly, comparator 514 generates a high output signal when current read address value RCG8–RCG0 is equal to current write address value WCG8–WCG0, comparator 516 generates a high output signal when last-used read address value RLG8–RLG0 is equal to current write address value WCG8–WCG0, and comparator 518 generates a high output signal when last-used read address value RLG8–RLG0 is equal to next-to-be-used write address value WNG8–WNG0.

The output signals generated by comparators 512 and 518 are transmitted to AND gates 522 and 524, respectively. AND gate 522 receives the output signal from comparator 512 and the READ_ALLOW control signal, and AND gate 524 receives the output signal from comparator 518 and the WRITE_ALLOW control signal. In accordance with another aspect of the present invention, AND gates 524 and 522 detect impending "full" and "empty" conditions of the FIFO memory (i.e., memory 101; see FIG. 1), and generate ALMOST_FULL and ALMOST_EMPTY signals that are latched into registers 544 and 542, respectively, immediately after the FIFO memory enters the actual "full" or "empty" condition. As discussed above, the READ_ALLOW control signal is generated when the externally supplied READ_ENABLE control signal is driven high and the EMPTY control signal is low. AND gate 522 generates the ALMOST_EMPTY signal when a last data value remains in the FIFO memory (which is detected by comparator 512) and a read operation is about to be performed (indicated by the high READ_ENABLE control signal). The ALMOST_EMPTY signal is then passed by OR gate 532 and latched into register 542 (i.e., forcing the EMPTY control signal high) by the same rising edge of RCLK that triggers a read operation in which the last data value is read from the FIFO memory. This coincidental generation of the EMPTY control signal and the last data value read operation prevents improper read operations from the empty FIFO memory. Similarly, as discussed above, the WRITE_ALLOW control signal is generated when the externally supplied WRITE_ENABLE control signal is driven high and the FULL control signal is low. AND gate 524 generates the ALMOST_FULL signal when data values are written into all but a last memory location in the FIFO memory (which is detected by comparator 518) and a write operation is about to be performed (indicated by the high WRITE_ENABLE control signal). The ALMOST_FULL signal is then passed by OR gate 534 and latched into register 544 (i.e., forcing the FULL control signal high) by the same rising edge of WCLK that triggers a write operation in which a data value is written into the last memory location of the FIFO memory. This coincidental generation of the FULL control signal and the last write operation prevents improper write operations to the full FIFO.

OR gate 532 receives the output signals from AND gate 522 and 9-bit comparator 514, and transmits a high output signal to the D input terminal of register 542 when the ALMOST_EMPTY signal is high, or when the output signal from comparator 514 is driven high. Similarly, OR gate 534 receives the output signals from AND gate 524 and 9-bit comparator 516, and transmits a high output signal to the D input terminal of register 544 when the ALMOST_FULL signal is high, or when the output signal from comparator 516 is driven high. As mentioned above, the high signals applied to the D input terminals of registers 542 and 544 are latched at the next rising edge of the RCLK and WCLK clock signals, respectively. Note that high EMPTY or FULL control signals toggle the READ_ALLOW and WRITE_ALLOW control signals (which are generated by AND gates 113 and 111; see FIG. 1) from a high logic level to a low logic level.

FIG. 5(B) is a block diagram showing a comparator circuit 230(2) in accordance with an alternative embodiment of the present invention. Comparator circuit 230(2) performs the same function as that performed by comparator circuit 230(1), but is optimized for use in PLDs in that it requires only two carry chains (versus four in comparator circuit 230(1)). Therefore, in at least some PLDs (e.g., Virtex FPGAs), comparator circuit 230(2) executes faster than comparator circuit 230(1), and is implemented using fewer resources than are required for comparator circuit 230(1).

Referring to FIG. 5(B), comparator circuit 230(2) includes dual comparators 550 and 560, logic OR gates 572 and 574, and registers (flip-flops) 582 and 584. Dual comparator 550 performs a function similar to that performed by nine-bit comparators 512 and 514, AND gate 522 and OR gate 532 of comparator circuit 230(1) (FIG. 5(A)). Specifically, dual comparator 550 uses exclusive-NOR (XNOR) gates to compare the same pairs of Gray-code signals that are compared by comparators 512 and 514, and uses mode control multiplexers (MUXes) to pass a selected group of XNOR gate output signals to the select terminals of series-connected carry chain MUXes. The final carry-out signal for the carry chain provides the data input for register 582. The EMPTY control signal generated by register 582 is used to select between the groups of XNOR gate output signals. When the EMPTY control signal is low, the selected group of XNOR gate output signals represent the "ALMOST_EMPTY" control signal generated by AND gate 522 of comparator circuit 230(1) (FIG. 5(A)). When the EMPTY control signal is high, the selected group of XNOR gate output signals represent the signal generated by comparator 514 of comparator circuit 230(1) (FIG. 5(A)). A logic "1" (high) signal is passed up through the carry chain MUXes when the selected group of XNOR gate output signals are all high. In a similar manner, dual comparator 560 performs a function similar to that performed by nine-bit comparators 516 and 518, AND gate 524, and OR gate 534 of comparator circuit 230(1). OR gates 572 and 574 perform a portion of the function provided by AND gates 522 and 524, respectively, of comparator circuit 230(1). Specifically, READ_ENABLE and WRITE_ENABLE control signals are applied to the clock enable (CE) terminal of registers 582 and 584 to generate high EMPTY and FULL control signals, respectively, immediately after the FIFO memory enters an empty/full condition.

Dual comparator 550 will now be discussed in additional detail. Dual comparator 550 includes eighteen XNOR gates (six shown), nine mode control MUXes (three shown), and nine carry chain MUXes (three shown). The XNOR gates are provided for comparing corresponding pairs of Gray-code signals received from read address register section 210 and write address register section 220 (see FIG. 2). For example, XNOR gate N0 compares signal WCG0 (received from current write address register 224) and signal RNG0 (received from binary-to-Gray-code converter 212), and generates a high output signal when these signals are equal (i.e., both low or both high). XNOR gate N1 compares signal WCG0 and signal RCG0 (received from current read address register 214), and generates a high output signal when these signals are equal (i.e., both low or both high). Similarly, XNOR gates N2 and N3 compare signal pairs WCG1 and RNG1, and WCG1 and RCG1, respectively. Additional XNOR gates (not shown) are provided to compare signal pairs WCG2 and RNG2, WCG2 and RCG2, WCG3 and RNG3, WCG3 and RCG3, WCG4 and RNG4, WCG4 and RCG4, WCG5 and RNG5, WCG5 and RCG5, WCG6 and RNG6, WCG6 and RCG6, WCG7 and RNG7, and WCG7 and RCG7. A final pair of XNOR gates N4 and N5 compare signal pairs WCG8 and RNG8, and WCG8 and RCG8, respectively.

The output terminals of adjacent XNOR gates are applied to the input terminals of the mode control MUXes. For example, the output terminals of XNOR gates N0 and N1 are applied to input terminals 0 and 1 of mode control MUX 551. The output terminals of XNOR gates N2 and N3 are applied to input terminals 0 and 1 of mode control MUX 552. Similarly, pairs of adjacent XNOR gates (not shown) are applied to the input terminals of associated mode control MUXes (also not shown) that are arranged in the manner shown in FIG. 5(B). Finally, the output terminals of XNOR gates N4 and N5 are applied to input terminals 0 and 1 of mode control MUX 553. Each of the mode control MUXes is controlled by the EMPTY control signal generated by register 582 to selectively pass either the even-numbered XNOR gate output signals (i.e., when the EMPTY control signal is low), or the odd-numbered XNOR gate output signals (i.e., when the EMPTY control signal is high). The output terminals of the mode control MUXes are transmitted to select (SI) terminals of corresponding carry chain MUXes.

Carry chain MUXes are connected in series to pass either a logic "1" (high) or a logic "0" (low) value to the D input terminal of register 582 in response to the XNOR gate output signals passed by the mode control MUXes. Each carry chain MUX includes a carry-in (CI) input terminal, a data-in (DI) input terminal, and a carry-out (CO) output terminal. When the signal applied to the select (SI) terminal of a carry chain MUX is high, the carry chain MUX passes the signal applied to its CI input terminal to the CO output terminal. Conversely, when the signal applied to the SI terminal of a carry chain MUX is low, the carry chain MUX passes the signal applied to its DI input terminal to the CO output terminal. The CI input terminal of a first carry chain MUX 554 is connected to a logic "1" source (e.g., VCC), and the CI input terminal of all remaining carry chain MUXes is connected to the CO output terminal of a preceding carry chain MUX. For example, the CI input terminal of carry chain MUX 555 is connected to the CO output terminal of carry chain MUX 554. The series of carry chain MUXes extends in parallel to the column of mode control MUXes until a final carry chain MUX 556 is reached. The CO output terminal of final carry chain MUX 556 is applied to the D input terminal of register 582.

Operation of dual comparator 550 is now described. During read operations (i.e., when the READ_ENABLE control signal is high), while the FIFO memory is not in the "empty" condition (i.e., the EMPTY control signal is low), the mode control MUXes pass the even-numbered XNOR gate output signals to the SI terminals of the carry chain MUXes (i.e., Gray-code signals WCG8–WCG0 are compared with Gray-code signals RNG8–RNG0). Similar to comparator 512 and AND gate 522, this arrangement produces a high signal at the input terminal of register 582 when the FIFO memory (i.e., memory 101; see FIG. 1) is in the "almost empty" state. If the READ_ENABLE control signal is high in the "almost empty" state, this high signal is latched into register 582 at the next rising edge of the RCLK clock signal, thereby generating a high EMPTY signal that is routed back to the select terminals of the mode control MUXes and to the OR gate 572. The high EMPTY signal causes the mode control MUXes to pass the odd-numbered XNOR gate output signals to the SI terminals of the carry chain MUXes (i.e., Gray-code signals WCG8–WCG0 are compared with Gray-code signals RCG8–RCG0). Similar to comparator 514, this arrangement produces a high signal at the input terminal of register 582 when the FIFO memory is in the "empty" state. Note that because OR gate 572 receives both the READ_ENABLE signal and the EMPTY control signal, a subsequent low READ_ENABLE signal does not disable register 582 as long as the EMPTY signal remains high. Therefore, the high EMPTY control signal is generated until one or more data values are written into the FIFO memory, thereby causing at least one of the odd-numbered XNOR gate output signals to switch low, which causes a low value to be latched into register 582.

Similar to dual comparator 550, dual comparator 560 includes eighteen XNOR gates (four shown), nine mode control MUXes (two shown), and nine carry chain MUXes (two shown). The XNOR gates are provided for comparing corresponding pairs of Gray-code signals in a manner similar to comparators 516 and 518 of comparator circuit 230(1) (FIG. 5(A)). For example, XNOR gate N7 compares signal RLG0 (received from last read address register 216) and signal WCG0 (received from current write address register 224), and XNOR gate N6 compares signal RLG0 and WNG0 (received from binary-to-Gray-code converter 222). Additional XNOR gates (not shown) are provided to compare signal pairs in a manner consistent with that used in dual comparator 550. A final pair of XNOR gates N8 and N9 compare signal pairs RLG8 and WNG8, and RLG8 and WCG8, respectively. The output terminals of adjacent XNOR gates are applied to the input terminals of the mode control MUXes (e.g., mode control MUXes 561 and 562). Each of the mode control MUXes is controlled by the FULL control signal generated by register 584 to selectively pass either the even-numbered XNOR gate output signals (i.e., when the FULL control signal is low), or the odd-numbered XNOR gate output signals (i.e., when the FULL control signal is high). The output terminals of the mode control MUXes are transmitted to select (SI) terminals of corresponding carry chain MUXes. Similar to their use in dual comparator 550, the carry chain MUXes (e.g., carry chain MUXes 563 and 564) of dual comparator 560 are connected in series to pass either a logic "1" (high) or a logic "0" (low) value to the D input terminal of register 584 in response to the XNOR gate output signals passed by the mode control MUXes. The CO output terminal of final carry chain MUX 564 is applied to the D input terminal of register 584. Operation of dual comparator 560 is similar to that of dual comparator 550, described above.

Those of ordinary skill in the art will recognize that comparator circuits 230(1) and 230(2) can be modified without changing their performed function. For example, in an alternative embodiment (not shown), the "empty" condition of memory 101 is detected using comparator 514 of comparator circuit 230(1) by comparing next-to-be-used write address value WNG8–WNG0 and next-to-be-used read value RNG8–RNG0. Similarly, the "full" condition of memory 101 can be detected using comparator 516 of comparator circuit 230(1) by comparing next-to-be-used write address value WNG8–WNG0 and current read address value RCG8–RCG0. Other Gray-code address values can also be generated that would provide equivalent comparisons for determining the "empty" and "full" conditions.

Simplified Example

Operation of a simplified FIFO memory system is now described. The simplified FIFO memory system of the present example differs from FIFO memory system 100 only in that the FIFO memory includes eight memory locations instead of 512. Of course, other changes to the circuitry of the simplified FIFO memory system are required to support the smaller FIFO memory. Therefore, references to circuitry of FIFO memory system 100 assume such changes.

The present example is described with reference to FIGS. 6(A), 6(B), and 7(A) through 7(F). An initial state of the FIFO memory system is described with reference to FIGS. 6(A), 6(B) and 7(A). Next, a series of write operations resulting in a "full" memory condition are described with reference to FIGS. 6(A), 7(B), and 7(C). Finally, a series of read operations that "empty" the FIFO memory are described with reference to FIGS. 6(B) and 7(D) through 7(F).

Figure 6A:
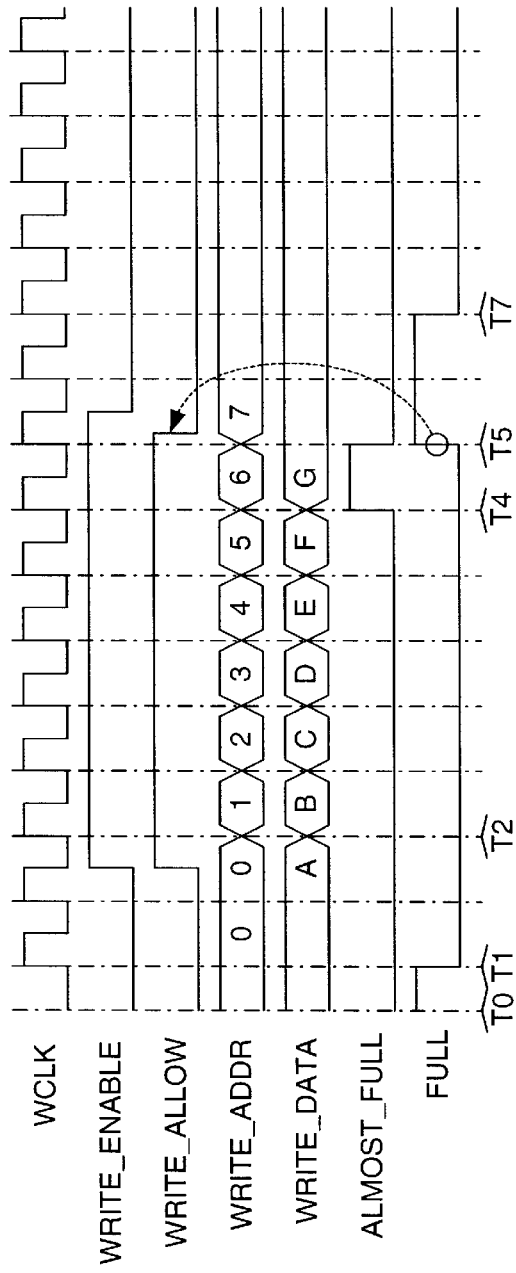
FIGS. 6(A) and 6(B) are timing diagrams illustrating signals helpful in describing a method of operating a FIFO memory system in accordance with a simplified example.
Figure 6B:
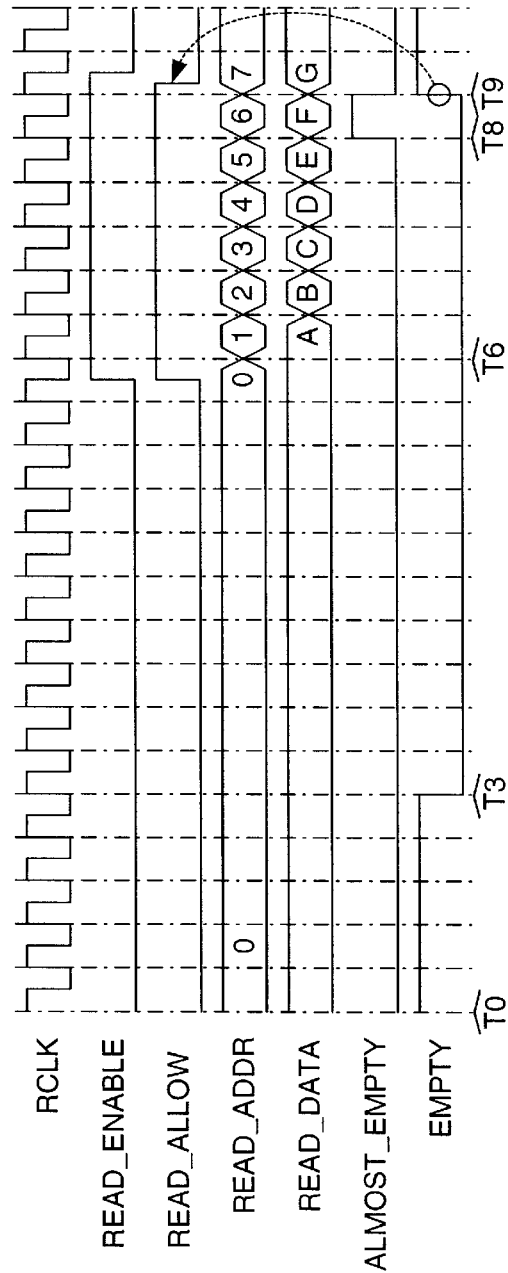

Referring to FIG. 6(A), when the FIFO memory system is initialized (time TO), the binary write address is reset to a predetermined initial address (e.g., 000), and the FULL control signal is initially set to a logic "1" value. Note that FULL control signal changes to logic "0" upon release of a reset signal and at the next rising edge of the write clock signal WCLK (i.e., at time T1). Referring to FIG. 6(B), at time T0, the binary read address is also reset to the predetermined initial address (e.g., 000), and the EMPTY control signal is also initially set to a logic "1" value. However, unlike the FULL control signal, the EMPTY control signal is maintained after release of the reset signal due to the identical initial read and write addresses. That is, referring to FIG. 7(A), both arrows associated with the current read address (CRA) and current write address (CWA) point to the same memory location (e.g., 000). As discussed above with reference to FIG. 5(A), when the current read address is equal to the current write address, comparator 514 generates a high signal that is latched by register 542 at the next rising edge of the RCLK signal. In a similar fashion, the initial EMPTY control signal is maintained after release of the reset signal in the present simplified example.

Data values are then written into the FIFO memory in response to an externally generated WRITE_ENABLE control signal. Referring to FIG. 6(A), in the present example, the WRITE_ENABLE control signal is asserted between times T1 and T2, thereby causing the WRITE_ALLOW control signal to switch high. With the WRITE_ALLOW signal high, a first write operation is performed at time T2, which corresponds to the next rising edge of the WCLK clock signal. Specifically, a data value A, which is applied to the data input terminal of the FIFO memory, is written into memory location 0 (binary 000) at the next rising edge of the WCLK clock signal (indicated at time T2) that occurs after the transition of the WRITE_ALLOW control signal to high. During the following sequence of write operations, data values B through G, which are also sequentially applied to the data input terminal of the FIFO memory, are written into the memory locations of the FIFO memory. Specifically, a data value B is written into memory location 1 (binary 001) at the next rising edge of the WCLK clock signal following time T2 (i.e., two rising edges following the transition of the WRITE_ALLOW control signal to high). The write address counter of the FIFO system (i.e., corresponding to write counter 103; see FIG. 1) then increments the write address value to 2 (binary 010), and then the FIFO memory writes a data value C into the memory location 2 at the next rising edge of the WCLK clock signal. In this manner, data values B through F are written into memory locations 1 through 5 of the FIFO memory between the times T2 and T4.

When the FIFO memory begins to store data, the EMPTY control signal switches from its initial high state to a low state. Referring briefly to FIG. 6(B), when the write address counter increments from the initial write address 0 to write address 1, the resulting inequality between the current write address and current read address causes the EMPTY signal to transition from logic "1" (high) to logic "0" (low). Specifically, referring to FIG. 5(A), because the current read and write address values are no longer equal, 9-bit comparator 514 generates a low output signal. Further, although the current write address is now equal to the next read address (i.e., causing 9-bit comparator 512 to generate a high output signal), the low READ_ALLOW signal maintains a low ALMOST_EMPTY signal, thereby causing register 542 to latch a logic "0" (low) at the next rising edge of the RCLK clock signal (time T3). Note that, although the release of the EMPTY signal may occur one or more cycles of the RCLK clock signal after the FIFO memory stores data value A (i.e., after the FIFO memory is no longer "empty"), this short delay is deemed acceptable because it prevents erroneous read operations from occurring before data is actually written into the FIFO memory.

The transition from the "almost full" to the "full" condition of the FIFO memory will now be explained.

Figure 7A:
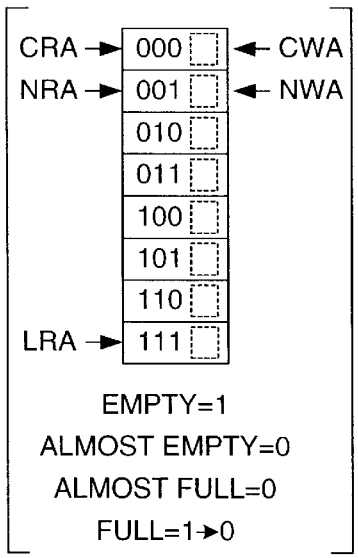
FIGS. 7(A), 7(B), 7(C), 7(D), 7(E) and 7(F) are diagrams illustrating different states of the FIFO memory system helpful in describing a method of operating a FIFO memory system in accordance with the simplified example.
Figure 7B:
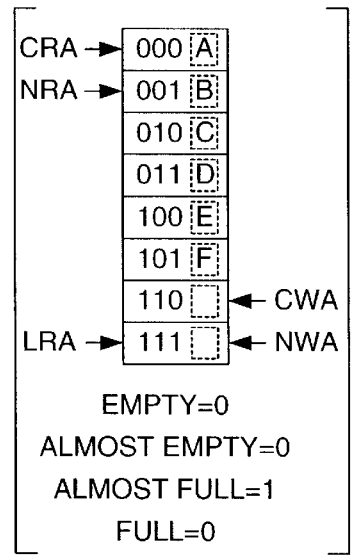

Returning to FIG. 6(A), successive write operations cause the FIFO memory to store data values A through G in memory locations 0 through 6. The "almost full" condition occurs just after the rising edge of the WCLK clock signal indicated at time T4. Specifically, the "almost full" condition occurs when the write address counter generates the current write address 6 and the WRITE_ALLOW control signal is high. Note that the data value G is present at the input port of the FIFO memory when the current write address 6 is generated by the write address counter, but is not written into the FIFO memory until the next rising edge of the WCLK clock signal (i.e., at time T5). This "almost full" state of the FIFO memory is depicted in FIG. 7(B), which shows data values A through F respectively stored in memory locations 0 through 5 (binary 000 through 101), and the current write address (CWA) pointing to memory location 6 (binary 110). Note that, in this state, both the next-to-be-used write address (NWA) and the last-used read address (LRA) are pointing to memory location 7 (binary 111). Referring again to FIG. 5(A), because both the NWA and the LRA are equal, comparator 518 generates a high output signal that is applied to an input terminal of AND gate 524. In addition, because the WRITE_ALLOW signal is high, AND gate 524 generates a high ALMOST_FULL signal that is applied to the D terminal of register 544.

The FIFO memory then transitions from the "almost full" condition to the "full" condition at the next rising edge of the WCLK clock signal. Referring back to FIG. 6(A), this next rising edge of the WCLK clock signal occurs at time T5, which corresponds to the transition from write address 6 to write address 7. As discussed above with reference to FIG. 5(A), the high ALMOST_FULL signal generated by AND gate 524 is latched by register 544 at the next rising edge of the WCLK clock signal, thereby producing a high FULL output signal. As discussed above, the high FULL signal forces the WRITE_ALLOW signal low, as indicated by the arrow in FIG. 6(A), thereby preventing the FIFO memory from storing a data value in memory location 7 at the next rising edge of the WCLK clock signal.

Figure 7C:
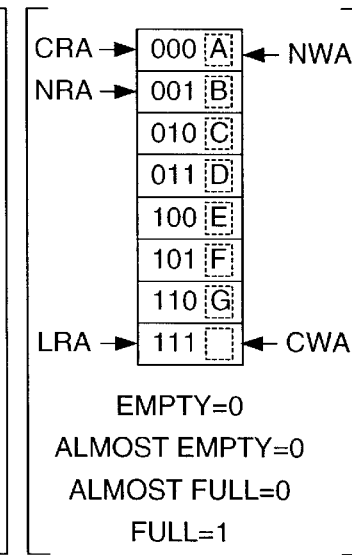

FIG. 7(C) depicts the FIFO memory in the "full" condition. Note that the FIFO memory is considered "full" even though a data value is not stored in one memory location (i.e., memory location 111).

In accordance with the present example, the externally generated WRITE_ENABLE signal is subsequently de-asserted, as shown in FIG. 6(A).

A series of read operations are now described with reference to FIGS. 6(B) and 7(D) through 7(F).

Referring to FIG. 6(B), in the present example, an externally generated READ_ENABLE control signal is asserted just before time T6, thereby causing the READ_ALLOW control signal to switch high. With the READ_ALLOW signal high, the read operation begins at time T6, which corresponds to the next rising edge of the RCLK clock signal. Subsequently, data values A through G are sequentially read from memory locations of the FIFO memory corresponding to the binary read addresses transmitted to the FIFO memory from a read address counter (i.e., corresponding to read counter 105; see FIG. 1). Specifically, FIG. 7(B) indicates that when the read address generated by the read counter increments to read address 1, the data value A appears at the data output terminals of the FIFO memory (i.e., is read from memory location 0 (binary 000)) during the first clock cycle following the transition of the READ_ALLOW control signal to high. The read address counter then increments the read address value to 2 (binary 010), and data value B is read from the memory location 1. In this manner, data values A through E are read from memory locations 0 through 4 of the FIFO memory between the times T6 and T8.

Figure 7D:
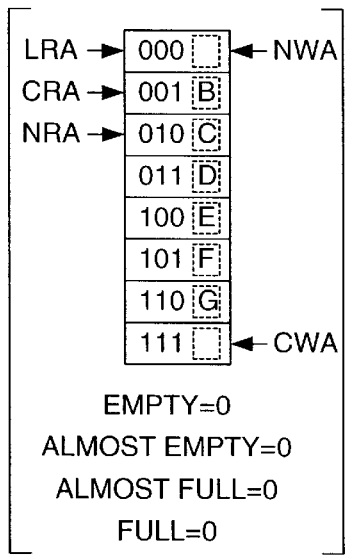

When data is read from the FIFO memory, the FULL control signal switches from its high state to a low state. Referring briefly to FIG. 6(A), the read address counter increments from the initial read address 0 to read address 1 at time T7. FIG. 7(D) depicts the state of the FIFO memory at time T7. Referring now to FIG. 7(D), the resulting inequality between the last-used read address (LRA) and current write address (CWA) causes the FULL signal to transition from logic "1" (high) to logic "0" (low). Specifically, the last-used read address (LRA) points to the same address as the next-to-be-used write address (NWA), and the current read address (CRA) and current write address (CWA) are pointing to different memory locations. Referring back to FIG. 5(A), because the last-used read address (LRA) and current write address (CWA) values are no longer equal, comparator 516 generates a low output signal. Further, although the next-to-be-used write address (NWA) is equal to the last read address (LRA) (i.e., causing comparator 518 to generate a high output signal), the low WRITE_ALLOW signal maintains a low ALMOST_FULL signal, thereby causing register 544 to latch a logic "0" (low) at the next rising edge of the WCLK clock signal (time T7). Note that, although the release of the FULL signal may occur one or more cycles of the WCLK clock signal after the FIFO memory transitions from the "full" condition, this short delay is deemed acceptable because it prevents erroneous write operations from occurring before data is actually read from the FIFO memory.

The transition from the "almost empty" to the "empty" condition of the FIFO memory is now explained.

Figure 7E:
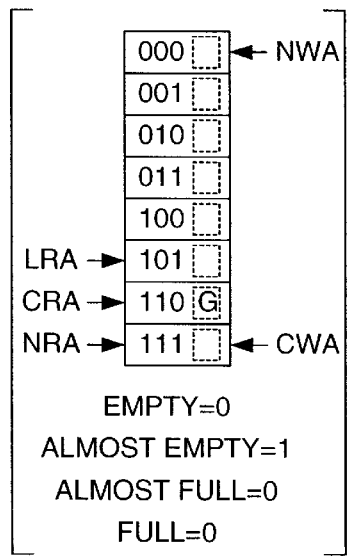

Returning to FIG. 6(B), successive read operations cause the FIFO memory to read out data values A through F from memory locations 0 through 5. The "almost empty" condition occurs just after the rising edge of the WCLK clock signal occurring at time T8. Specifically, the "almost empty" condition occurs when the read address counter generates the current read address 6 (and reads data value F from memory location 5). This "almost empty" state of the FIFO memory is depicted in FIG. 7(E), which shows all but data value G read from the memory locations 0 through 5 (binary 000 through 101), and the current read address (CRA) pointing to memory location 6 (binary 110). Note that, in this state, both the next-to-be-used read address (NRA) and the current write address (CWA) are pointing to memory location 7 (binary 111). Referring again to FIG. 5(A), because both the next-to-be-used read address (NRA) and the current write address (CWA) are equal, comparator 512 generates a high output signal that is applied to an input terminal of AND gate 522. In addition, because the READ_ALLOW signal is high, AND gate 522 generates a high ALMOST_EMPTY signal that is applied to the D terminal of register 542.

The FIFO memory then transitions from the "almost empty" condition to the "empty" condition at the next rising edge of the RCLK clock signal. Referring back to FIG. 6(B), this next rising edge of the RCLK clock signal occurs at time T9, which corresponds to the transition from read address 6 to read address 7. As discussed above with reference to FIG. 5(A), the high ALMOST_EMPTY signal generated by AND gate 522 is latched by register 542 at the next rising edge of the RCLK clock signal, thereby producing a high EMPTY output signal. As discussed above and indicated by the dashed arrow in FIG. 6(B), the high EMPTY signal forces the READ_ALLOW signal low, thereby preventing the FIFO memory from reading a data value from memory location 7 at the next rising edge of the RCLK clock signal.

Figure 7F:
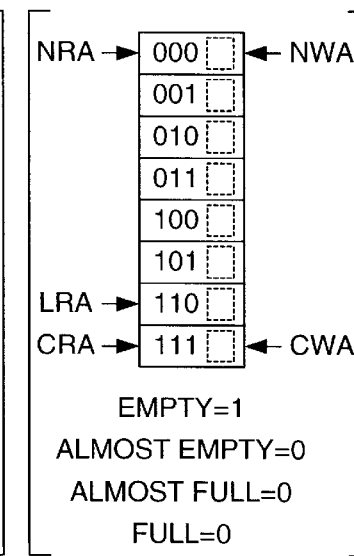

FIG. 7(F) depicts the FIFO memory in a final "empty" condition. Note that the FIFO memory is considered "empty" when no valid data values are stored in any memory location of the FIFO memory.

Status Control Circuit

Figure 8:
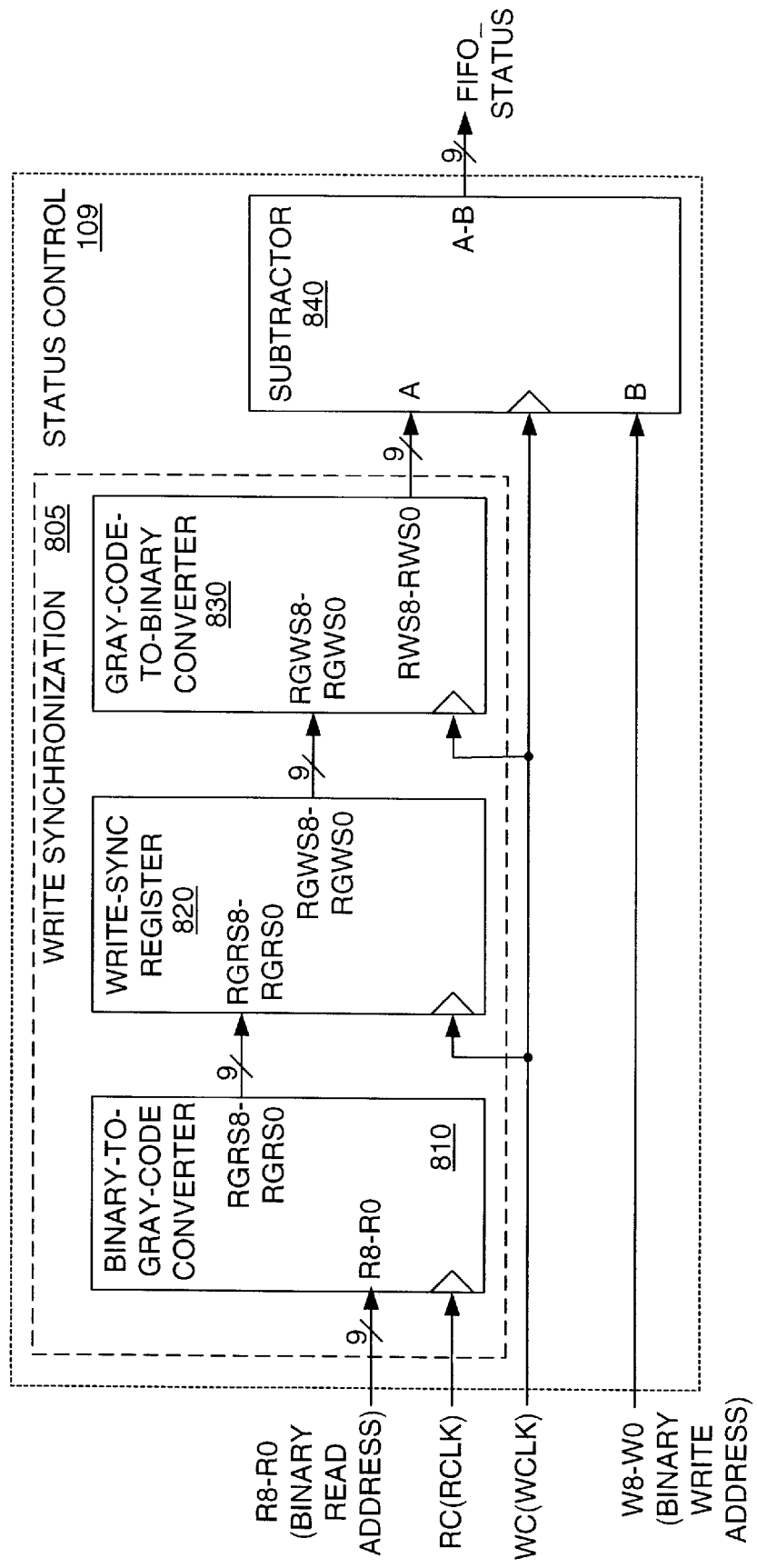
FIG. 8 is a block diagram showing a status control circuit of the FIFO memory system shown in FIG. 1.

FIG. 8 is a block diagram showing status control circuit 109 of FIFO memory circuit 100 (see FIG. 1) in additional detail. Status control circuit 109 is generally divided into a write synchronization section 805 and a subtractor circuit 840. Write synchronization section 805 includes a binary-to-Gray-code converter 810, a write-synchronization (WRITE-SYNC) register 820, and a Gray-code-to-binary converter 830. Binary-to-Gray-code converter 810 converts the binary read address R8–R0 into a Gray-code read address value RGRS8–RGRS0 that is synchronized to the RCLK clock signal. Write synchronization register 820 then re-synchronizes the Gray-code read address value RGRS8–RGRS0 to the WCLK (write) clock signal, and stores these re-synchronized values as Gray-code read address value RGWS8–RGWS0. Gray-code-to-binary converter 830 then re-converts the Gray-code read address value RGWS8–RGWS0 to form a write-synchronized binary read address RWS8–RWS0 that is also synchronized to the WCLK clock signal. The write-synchronized binary read address RWS8–RWS0 is then transmitted to subtractor circuit 840, along with the binary write address (W8–W0) currently generated by write address counter 103 (see FIG. 1). Subtractor circuit 840 then subtracts the write-synchronized binary read address RWS8–RWS0 from the binary write address to determine the difference between these addresses, and transmits the difference as a nine-bit (or less) FIFO_STATUS control signal that indicates the amount of data currently stored in the FIFO memory (i.e., memory 101; see FIG. 1). In one embodiment, only the three or four most significant bits are used to identify the amount of data stored in the FIFO memory, because the less significant bits are typically not useful, and because latency can produce errors in the least significant bits. Because both the write-synchronized binary read address RWS8–RWS0 and the binary write address W8–W0 are synchronized to the same clock (WCLK), the FIFO_STATUS control signal provides an accurate difference between the binary addresses generated by write address counter 103 and read address counter 105 (both shown in FIG. 1), thereby providing an accurate indication of the amount of data stored in the FIFO memory.

As used herein, the term "accurate" is intended to include a range of imprecision resulting from the difference in frequency between the WCLK and RCLK clock signals. For example, when the difference is relatively large (i.e., when the WCLK clock signal is significantly slower than the RCLK clock signal), the amount of data determined by status control circuit 109 may be imprecise by a few memory location values that accrue between the rising edges of the WCLK clock signal. The term "accurate" is intended to include this range of imprecision.

Figure 9:
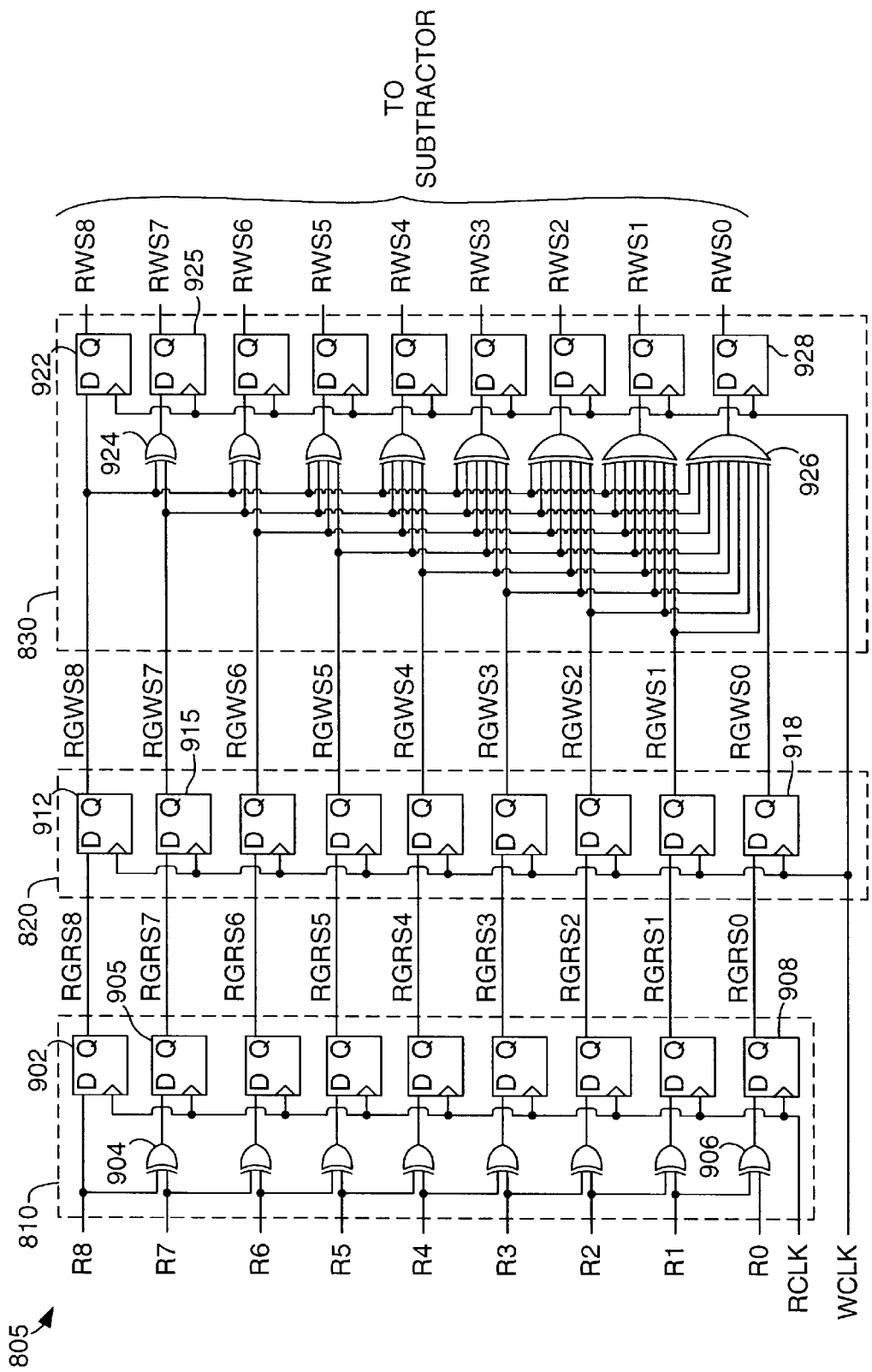
FIG. 9 is a simplified circuit diagram showing a write synchronization section of the status control circuit of FIG. 8.

FIG. 9 is a circuit diagram showing write synchronization section 805 of status control circuit 109 in accordance with one embodiment of the present invention. Specifically, FIG. 9 shows additional details associated with binary-to-Graycode converter 810, write synchronization register 820, and gray-code-to-binary converter 830, which are described in the following paragraphs. Note that subtractor circuit 840 is implemented using circuit arrangements that are well known in the art, and is therefore not described in additional detail herein.

Binary-to-Gray-code converter 810 includes logic for converting binary read address signals R8–R0 into a nine-bit Gray-code read address value, and nine parallel registers (e.g., D flip-flops) for storing the Gray-code read address value. Binary-to-Gray-code conversion is executed by passing a most significant bit R8 of the current binary read address signal R8–R0 to a first register 902, and using XOR logic gates to operate on selected pairs of current binary read address signal R8–R0 to generate the remaining eight Gray-code address bit values that are stored in the remaining parallel registers in the manner shown in FIG. 9. For example, bits R8 and R7 of the current binary read address signal are applied to the input terminals of XOR gate 904, whose output signal is transmitted to the D input terminal of register 905. Bit pairs R7 and R6, R6 and R5, R5 and R4, R4 and R3, R3 and R2, and R2 and R1 are similarly XORed together and applied to the D input terminals of associated registers. Finally, bit pair R1 and R0 are applied to the input terminals of a last XOR gate 906, whose output terminal is connected to the D input terminal of a last register 908. As discussed above with reference to flag control circuit 107, many other circuits can also be used to generate sequences that follow a Gray code counting cycle. Therefore, the appended claims are not necessarily restricted to the specific XOR arrangement shown in FIG. 9.

The nine parallel registers of binary-to-Gray-code converter 810 store the read-synchronized read address value RGRS8–RGRS0 during each read operation. Specifically, in response to a high READ_ALLOW control signal (see FIG. 1), read address counter 105 generates a current binary read address that is applied to memory 101, flag control circuit 107, and to binary-to-Gray-code converter 810 of status control circuit 109. The nine bits of the current binary read address are converted into an initial Gray-code read address value that is stored in the nine parallel registers of binary-to-Gray-code converter 810 on the next rising edge of the RCLK clock cycle as Gray-code read address value RGRS8–RGRS0. Gray-code read address value RGRS8–RGRS0 is then transmitted from the Q output terminals of the nine parallel registers to write synchronization register circuit 820.

Write synchronization register circuit 820 receives the Gray-code read address value RGRS8–RGRS0, and includes nine parallel registers that are controlled by the WCLK (write) clock signal. The nine parallel registers are essentially identical to those used in binary-to-Gray-code converter 810. Note that the Gray-code read address value RGRS8–RGRS0 is stored in the parallel registers of write synchronization register circuit 820 at the next rising edge of the WCLK clock signal, thereby becoming write-synchronized Gray-code address values RGWS8–RGWS0. Specifically, bit RGRS8 of the Gray-code read address value RGRS8–RGRS0 is latched into a first register 912 on the first rising edge of the WCLK clock signal after it appears on the Q output terminal of register 902 of binary-to-Gray-code converter 810. Similarly, bit RGRS7 is latched into a register 915, and bit RGRS0 is latched into a register 918 on the next rising edge of the WCLK clock signal. The write-synchronized Gray-code read address value RGWS8–RGWS0 is then transmitted from the Q output terminals of the nine parallel registers to Gray-code-to-binary converter 830.

Gray-code-to-binary converter 830 includes logic for converting write-synchronized Gray-code read address value RGWS8–RGWS0 into write-synchronized binary read address RWS8–RWS0, and nine parallel registers (e.g., D flip-flops) for storing the write-synchronized binary read address RWS8–RSW0. The Gray-code-to-binary conversion is executed by passing a most significant bit RGWS8 of the write-synchronized Gray-code read address value RGWS8–RGWS0 to a first register 922, and using XOR logic gates to operate on selected write-synchronized Gray-code read address value RGWS8–RGWS0 to generate the remaining eight write-synchronized read address bits that are stored in the remaining parallel registers in the manner shown in FIG. 9. For example, bits RGWS8 and RGWS7 of the write-synchronized Gray-code read address value RGWS8–RGWS0 are applied to the input terminals of XOR gate 924, whose output signal is transmitted to the D input terminal of register 925. Bit groups RGWS8 through RGWS6, RGWS8 through RGWS5, RGWS8 through RGWS4, RGWS8 through RGWS3, RGWS8 through RGWS2, and RGWS8 through RGWS1 are similarly XORed and stored. A final bit group RGWS8 through RGWS0 is applied to the input terminals of a last XOR gate 926 whose output terminal is connected to the D input terminal of a last register 928. Note that the Gray-code-to-binary conversion circuitry utilized in Gray-code-to-binary converter 830 is not restricted to that specifically shown in FIG. 9, but must be consistent with the binary-to-Gray-code conversion circuitry used in binary-to-Gray-code converter 810 (described above).

Those of ordinary skill in the art will recognize that status control circuit 109 can be modified without changing its performed function. For example, write-synchronization of the binary read address could be performed without Gray-coding. However, unless propagation of the binary read address is controlled to avoid glitches, performing write-synchronization without Gray-coding is less reliable than with Gray-coding.

Although the invention has been described in connection with several embodiments, it is understood that this invention is not limited to the embodiments disclosed, but is capable of various modifications which would be apparent to a person skilled in the art. For example, one skilled in the art could use other logic circuitry to perform the functions described in the specification. Moreover, FIFO memory system 100 can be modified to operate in accordance with a memory 101 having other sizes. The read address counter, write address counter and flag control circuit would then be modified in accordance with the principles previously described to generate the EMPTY and FULL control signals. Further, a synchronous FIFO memory system can be constructed using flag control circuit 107 (described above). Moreover, a FIFO memory system can be constructed that includes status control circuit 109, but utilizes conventional circuitry for generating FULL and EMPTY control signals. Further, a FIFO memory system according to the invention can be constructed using other types of encoding (i.e., other than Gray-code), although codes providing single-bit changes in count values are preferred. Therefore, the invention is limited only by the following claims.

We claim:

1. A first in, first out (FIFO) memory system, comprising:
a memory having a plurality of locations each having an address, a write address port for receiving a sequence of write address values during write operations, and a read address port for receiving a sequence of read address values during read operations; and a flag control circuit including:
- a first multi-bit comparator for detecting an almost-empty condition, which occurs when only one data value is stored in the memory, by comparing a first read address value associated with the sequence of read address values to a first write address value associated with the sequence of write address values;
- a first logic circuit connected to an output terminal of the first multi-bit comparator, wherein the first logic circuit asserts an ALMOST_EMPTY control signal on an output terminal when the first multi-bit comparator detects the almost-empty condition during a read operation; and
- a register for asserting an EMPTY control signal when there are no data values stored in the memory, the register having a data input terminal coupled to the output terminal of the first logic circuit, and a clock input terminal connected to receive a clock signal;
- wherein the register latches the ALMOST_EMPTY control signal immediately after the ALMOST_EMPTY control signal is asserted by the first logic circuit, thereby causing the register to assert the EMPTY control signal during the same clock cycle of the clock signal in which said only one data value is read from the memory.

2. The FIFO memory system according to claim 1, further comprising a second logic circuit including an output terminal connected to a read enable terminal of the memory, a first input terminal connected to receive an externally-generated READ_ENABLE signal, and a second input terminal connected to receive the EMPTY control signal from the register, wherein the second logic circuit asserts a READ_ALLOW signal when the READ_ENABLE signal is asserted and the EMPTY control signal is de-asserted.

3. The FIFO memory system according to claim 1, wherein the flag control circuit further comprises:
- a read address register section including a first binary-to-Gray-code converter providing the first read address value by converting a binary read address value of the sequence of read address values into a Gray-code value; and
- a write address register section including a second binary-to-Gray-code converter providing the first write address value by converting a binary write address value of the sequence of write address values into a Gray-code value.

4. The FIFO memory system according to claim 1, wherein the memory, first multi-bit comparator, first logic circuit, and register are implemented using a field programmable gate array.

5. The FIFO memory system according to claim 1, wherein the memory is a dual-port memory.

6. The FIFO memory system according to claim 1, wherein the sequence of write address values and the sequence of read address values are generated synchronously.

7. The FIFO memory system according to claim 1, wherein the sequence of write address values and the sequence of read address values are generated asynchronously.

8. The FIFO memory system according to claim 1, further comprising a second logic circuit coupled between the output terminal of the first logic circuit and the data input terminal of the register.

9. The FIFO memory system according to claim 1, wherein the flag control circuit further comprises:
- a second multi-bit comparator for detecting an empty condition of the memory by comparing a second read address value associated with the sequence of read address values to the first write address value, the second multi-bit comparator having an output terminal; and
- a second logic circuit coupled between the output terminal of the first multi-bit comparator and the data input terminal of the register, and between the output terminal of the second multi-bit comparator and the data input terminal of the register.

10. The FIFO memory system according to claim 9, wherein the flag control circuit further comprises:
- a read address register section, including a first binary-to-Gray-code converter, providing the first and second read address values by converting binary read address values of the sequence of read address values into Gray-code values; and
- a write address register section including a second binary-to-Gray-code converter, providing the first write address value by converting a binary write address value of the sequence of write address values into a Gray-code value.

11. A first in, first out (FIFO) memory system, comprising:
- a memory having a plurality of locations each having an address, a write address port for receiving a sequence of write address values during write operations, and a read address port for receiving a sequence of read address values during read operations; and
- a flag control circuit including:
  - a first multi-bit comparator for detecting an almost-full condition, which occurs when data values are stored in all but a last location of the memory, by comparing a first read address value associated with the sequence of read address values to a first write address value associated with the sequence of write address values;
  - a first logic circuit connected to an output terminal of the first multi-bit comparator, wherein the first logic circuit asserts an ALMOST_FULL control signal on an output terminal when the first multi-bit comparator detects the almost-full condition during a write operation; and
  - a register for asserting a FULL control signal when data values are stored in all locations of the memory, the register having a data input terminal coupled to the output terminal of the first logic circuit, and a clock input terminal connected to receive a clock signal;
  - wherein the register latches the ALMOST_FULL control signal immediately after the ALMOST_FULL control signal is asserted by the first logic circuit, thereby causing the register to assert the FULL control signal during the same clock cycle of the clock signal in which a data value is written to said last location of the memory.

12. The FIFO memory system according to claim 11, further comprising a second logic circuit including an output terminal connected to a write enable terminal of the memory, a first input terminal connected to receive an externally-generated WRITE_ENABLE signal, and a second input terminal connected to receive the FULL control signal from the register, wherein the second logic circuit asserts a WRITE_ALLOW signal when the WRITE_ENABLE signal is asserted and the FULL control signal is de-asserted.

13. The FIFO memory system according to claim 11, wherein the flag control circuit further comprises:
- a read address register section, including a first binary-to-Gray-code converter, providing the first read address value by converting a binary read address value of the sequence of read address values into a Gray-code value; and a write address register section, including a second binary-to-Gray-code converter, providing the first write address value by converting a binary write address value of the sequence of write address values into a Gray-code value.

14. The FIFO memory system according to claim 11, wherein the memory, first multi-bit comparator, logic circuit, and register are implemented using a field programmable gate array.

15. The FIFO memory system according to claim 11, wherein the memory is a dual-port memory.

16. The FIFO memory system according to claim 11, wherein the sequence of write address values and the sequence of read address values are generated synchronously.

17. The FIFO memory system according to claim 11, wherein the sequence of write address values and the sequence of read address values are generated asynchronously.

18. The FIFO memory system according to claim 11, further comprising a second logic circuit coupled between the output terminal of the first logic circuit and the data input terminal of the register.

19. The FIFO memory system according to claim 11, wherein the flag control circuit further comprises:

a second multi-bit comparator for detecting a full condition of the memory by comparing a second write address value associated with the sequence of write address values to the first read address value, the second multi-bit comparator having an output terminal; and a second logic circuit coupled between the output terminal of the first multi-bit comparator and the data input terminal of the register, and between the output terminal of the second multi-bit comparator and the data input terminal of the register.

20. The FIFO memory system according to claim 19, wherein the flag control circuit further comprises:

a read address register section, including a first binary-to-Gray-code converter, providing the first read address value by converting a binary read address value of the sequence of read address values into a Gray-code value; and a write address register section, including a second binary-to-Gray-code converter, providing the first and second write address values by converting binary write address values of the sequence of write address values into Gray-code values.

21. A first in, first out (FIFO) memory system, comprising:

a memory having a plurality of locations each having an address, a write address port for receiving a sequence of write address values during write operations, and a read address port for receiving a sequence of read address values during read operations; and a flag control circuit including:

first means for detecting an almost-empty condition, which occurs when only one data value is stored in the memory, by comparing a first read address value associated with the sequence of read address values to a first write address value associated with the sequence of write address values, and for asserting an ALMOST_EMPTY control signal on an output terminal when the almost-empty condition is detected during a read operation;

a first register for asserting an EMPTY control signal when there are no data values stored in the memory, the register having a data input terminal coupled to the output terminal of the first means, and a clock input terminal connected to receive a read clock signal;

second means for detecting an almost-full condition, which occurs when data values are stored in all but a last location of the memory, by comparing a second read address value associated with the sequence of read address values to a second write address value associated with the sequence of write address values, and for asserting an ALMOST_FULL control signal on an output terminal when the almost-full condition is detected during a write operation; and a second register for asserting a FULL control signal when data values are stored in all locations of the memory, the register having a data input terminal coupled to the output terminal of the second means, and a clock input terminal connected to receive a write clock signal;

wherein the first register latches the ALMOST_EMPTY control signal immediately after the ALMOST_EMPTY control signal is asserted by the first means, thereby causing the first register to assert the EMPTY control signal during the same clock cycle of the read clock signal in which said one data value is read from the memory, and wherein the second register latches the ALMOST_FULL control signal immediately after the ALMOST_FULL control signal is asserted by the second means, thereby causing the second register to assert the FULL control signal during the same clock cycle of the write clock signal in which a data value is written to said last location of the memory.

22. The FIFO memory system according to claim 21, wherein the flag control circuit further comprises:

third means for detecting an empty condition of the memory by comparing a third read address value associated with the sequence of read address values to the first write address value, and for providing a first output signal on an output terminal; and fourth means for detecting a full condition of the memory by comparing the first write address value to the second read address value, and for providing a second output signal on an output terminal, wherein the data input terminal of the first register is coupled to the output terminal of the third means, and wherein the data input terminal of the second register is coupled to the output terminal of the fourth means.

23. The FIFO memory system according to claim 21, further comprising:

a first logic circuit coupled between the output terminal of the first means and the data input terminal of the first register; and a second logic circuit coupled between the output terminal of the second means and the data input terminal of the second register.

* * * * *